(12) United States Patent
Takeda et al.

(10) Patent No.: US 6,911,787 B2
(45) Date of Patent: Jun. 28, 2005

(54) DRIVING METHOD AND DRIVING CIRCUIT FOR PIEZOELECTRIC TRANSFORMER, COLD-CATHODE TUBE LIGHT-EMITTING APPARATUS, LIQUID CRYSTAL PANEL AND DEVICE WITH BUILT-IN LIQUID CRYSTAL PANEL

(75) Inventors: Katsu Takeda, Osaka (JP); Hiroshi Nakatsuka, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 52 days.

(21) Appl. No.: 10/719,546

(22) Filed: Nov. 21, 2003

(65) Prior Publication Data

US 2004/0104884 A1 Jun. 3, 2004

(30) Foreign Application Priority Data

Nov. 25, 2002 (JP) ........................ 2002-341436

(51) Int. Cl.[7] ............................................. H05B 37/02
(52) U.S. Cl. .................. 315/209 PZ; 315/55; 315/224; 315/247; 315/308
(58) Field of Search .................... 315/55, 209 PZ, 315/224–226, 246–247, 287, 291, 307–308, 309; 310/311, 314

(56) References Cited

U.S. PATENT DOCUMENTS

| | | | | |
|---|---|---|---|---|
| 5,675,484 A | * | 10/1997 | Shimada | 363/71 |
| 5,705,877 A | * | 1/1998 | Shimada | 310/318 |
| 5,859,489 A | * | 1/1999 | Shimada | 310/318 |
| 5,866,969 A | * | 2/1999 | Shimada et al. | 310/318 |
| 5,886,477 A | * | 3/1999 | Honbo et al. | 315/209 PZ |
| 5,923,546 A | * | 7/1999 | Shimada et al. | 363/40 |
| 5,942,835 A | * | 8/1999 | Furuhashi et al. | 310/316.01 |
| 5,969,963 A | * | 10/1999 | Ohnishi et al. | 363/132 |
| 6,028,398 A | * | 2/2000 | Kawasaki et al. | 315/224 |
| 6,118,221 A | * | 9/2000 | Kumasaka et al. | 315/209 PZ |
| 6,153,962 A | * | 11/2000 | Noma et al. | 310/316.01 |
| 6,184,631 B1 | * | 2/2001 | Noma et al. | 315/224 |
| 6,226,196 B1 | * | 5/2001 | Toshinari et al. | 363/134 |

FOREIGN PATENT DOCUMENTS

| | | |
|---|---|---|
| JP | 10-201241 | 7/1998 |
| JP | 10-201245 | 7/1998 |

* cited by examiner

*Primary Examiner*—Thuy V. Tran
(74) *Attorney, Agent, or Firm*—Hamre, Schumann, Mueller & Larson, P.C.

(57) ABSTRACT

There is provided a method for driving a piezoelectric transformer in which a driving efficiency and the reliability in terms of withstand power and distortion can be enhanced by suppressing a higher order vibration mode exited by a harmonic component other than a driving frequency included in a driving signal of the piezoelectric transformer without using an inductive element. The driving signal applied to a primary side electrode of the piezoelectric transformer is a signal in a rectangular waveform having a time period δT in which a level is a maximum potential (2V) or a minimum potential (0), obtained by multiplying a period T of the driving signal by a predetermined time ratio δ. The time ratio δ is set to be smaller than 0.5 and so as to minimize a sum of ratios of amplitudes of respective higher order vibration modes with respect to an amplitude of a vibration mode exciting the piezoelectric transformer.

42 Claims, 16 Drawing Sheets

DRIVING METHOD AND DRIVING CIRCUIT FOR PIEZOELECTRIC TRANSFORMER, COLD-CATHODE TUBE LIGHT-EMITTING APPARATUS, LIQUID CRYSTAL PANEL AND DEVICE WITH BUILT-IN LIQUID CRYSTAL PANEL

BACKGROUND OF THE INVENTION

1. Field of the Invention

The present invention relates to a driving method and a driving circuit for a piezoelectric transformer, a cold-cathode tube light-emitting apparatus using a cold-cathode tube as a load of a piezoelectric transformer in the driving method and the driving circuit, a liquid crystal panel in which the cold-cathode tube light-emitting apparatus is built, whereby brightness is controlled, and a device with a built-in liquid crystal panel, such as a mobile telephone, a portable information terminal (PDA: Personal Digital Assistant), a communication terminal, etc., in which the liquid crystal panel is built.

2. Description of the Related Art

Hereinafter, a conventional method for driving a piezoelectric transformer will be described.

The piezoelectric transformer has a configuration in which a primary (input) side electrode and a secondary (output) side electrode are formed on a piezoelectric material, an AC voltage in the vicinity of a resonance frequency of the piezoelectric transformer is applied to the primary side electrode to vibrate the piezoelectric transformer mechanically, and the mechanical vibration is converted by a piezoelectric effect so as to be output from the secondary side electrode. The piezoelectric transformer can be handled at an energy density higher than that of an electromagnetic transformer. Therefore, the piezoelectric transformer can be rendered smaller and thinner, compared with the electromagnetic transformer, so that a high conversion efficiency can be realized.

Furthermore, the piezoelectric transformer converts energy via electrical/mechanical conversion. Therefore, the electromagnetic noise of the piezoelectric transformer emitted to a space is much smaller than that of the electromagnetic transformer.

Generally, in the piezoelectric transformer, due to the impedance of a load connected to the secondary side, a voltage step-up ratio, which represents a ratio of a voltage output from the secondary side with respect to a voltage input to the primary side, is varied. Furthermore, a driving efficiency represented by the electric power output from the secondary side with respect to the electric power input to the primary side is varied similarly. Therefore, the driving frequency also is varied, which enables the maximum voltage step-up ratio and driving efficiency to be obtained. More specifically, in order to drive the piezoelectric transformer efficiently at a predetermined voltage step-up ratio, it is required to set the driving frequency in accordance with the impedance of a load to be connected.

For example, in the case of using a cold-cathode tube as a load of the piezoelectric transformer, the cold-cathode tube generally exhibits a high impedance equal to or more than hundreds of MΩ until it lights up, and the impedance decreases rapidly to a range between hundreds of kΩ and tens of kΩ after it lights up. Therefore, in order to allow the cold-cathode tube to light up efficiently by using the piezoelectric transformer, it is required to change the frequency and the level of a voltage applied to the primary side of the piezoelectric transformer between a period before the commencement of lighting and a period after lighting.

In the case of configuring an inverter circuit, using the piezoelectric transformer, a rectangular wave is formed at a frequency in the vicinity of a resonance frequency of the piezoelectric transformer, using at least one switching element. Furthermore, a filter circuit is provided between the output side of the switching element and the primary side of the piezoelectric transformer, whereby the piezoelectric transformer is driven under a condition of an input voltage of the piezoelectric transformer being approximated to a sine wave as closely as possible.

In order to enhance the conversion efficiency of the piezoelectric transformer, it is required to minimize the input of a frequency component, other than those for driving the piezoelectric transformer, to the piezoelectric transformer. In the case where an inverter circuit is configured using the piezoelectric transformer, since the piezoelectric transformer is a capacitive element, it is required to provide a filter circuit using an inductor between a switching element and a primary side electrode of the piezoelectric transformer according to a conventional driving method.

As a prior art for realizing the above, a power conversion apparatus (Conventional Example 1) as shown in FIG. 16A is known (or example, see page 5, FIGS. 1(b), 6, and 8 in JP 10(1998)-201241 A), and a power conversion apparatus (Conventional Example 2) as shown in FIG. 17 also is known (for example, see page 5, FIGS. 4, 5, and 9 in JP 10(1998)-201245 A).

Conventional Examples 1 and 2 are exemplary methods for driving a piezoelectric transformer with a stepped waveform signal, in which an inverter circuit is configured using a piezoelectric transformer.

In Conventional Example 1 shown in FIG. 16A, the timing of charging/discharging of capacitors C1, C2, and C3 is controlled by switching elements for charging S1, S2, S3, S4, and S5, and switching elements for discharging S6, S7, S8, S9, and S10, whereby a voltage level is set from a D.C. power supply 103. A stepped voltage waveform in which the time of one step is W1 is generated by the setting of a voltage level and the timing of switching of the switching elements Sa, Sb, Sc, and Sc, as shown in FIG. 16B. The stepped voltage waveform is applied to the piezoelectric transformer 101, thereby supplying a load 102 with a power.

Furthermore, in Conventional Example 2 shown in FIG. 17, an inductor 104 is connected between a common connecting portion A of the switching elements Sa and Sb, and one of primary side electrodes of a piezoelectric transformer 101. A capacitor 105 is connected between both the primary side electrodes of the piezoelectric transformer 101. The inductor 104 and the capacitor 5 constitute a filter circuit, and shape the stepped waveform shown in FIG. 16B into a sine wave.

However, the above-mentioned Conventional Examples 1 and 2 merely disclose a method for driving a piezoelectric transformer with a stepped waveform signal.

There are a plurality of vibration modes of the piezoelectric transformer. Therefore, in the case where the piezoelectric transformer is driven with a driving waveform other than a sine wave, a reactive power is increased due to the capacitance component of an input part of the piezoelectric transformer, or a harmonic component excites a high-order vibration mode of the piezoelectric transformer.

Therefore, in the case of using a cold-cathode tube as a load of the piezoelectric transformer, it is required that an inverter circuit should handle a reactive power, as well as a power required for lighting up the cold-cathode tube. As a result, the efficiency of the inverter circuit decreases and the efficiency decreases due to the influence of a dielectric loss in the piezoelectric transformer, which makes it difficult to enhance a conversion efficiency.

Furthermore, when a high-order vibration mode of the piezoelectric transformer is excited with a harmonic component, distortion due to a high-order vibration mode superimposed on a desired vibration mode may be generated in the piezoelectric transformer. This causes a decrease in the withstand power of the piezoelectric transformer, and degradation of the characteristics due to a large amplitude operation, leading to a decrease in reliability.

The above-mentioned problem becomes an obstacle to the miniaturization of a piezoelectric inverter, and the miniaturization of communication equipment using a liquid crystal panel in which a light-emitting apparatus of a cold-cathode tube is built, using a piezoelectric inverter.

SUMMARY OF THE INVENTION

Therefore, with the foregoing in mind, it is an object of the present invention to provide a driving method and a driving circuit for a piezoelectric transformer, in which the value of an input current of a harmonic component other than a driving frequency included in a driving signal of a piezoelectric transformer is suppressed without using an inductive element, whereby a driving efficiency of the piezoelectric transformer is enhanced, and electromagnetic noise is suppressed.

It is another object of the present invention to provide a driving method and a driving circuit for a piezoelectric transformer in which reliability is enhanced in terms of withstand power and distortion by suppressing a higher order vibration mode excited by a harmonic component other than a driving frequency, included in a driving signal of the piezoelectric transformer.

It is still another object of the present invention to provide a cold-cathode tube light-emitting apparatus that controls the light emission of a cold-cathode tube by using the above-mentioned driving method and driving circuit for the piezoelectric transformer, a liquid crystal panel that incorporates the cold-cathode tube light-emitting apparatus, and a device with a built-in liquid crystal panel such as a mobile telephone and a communication terminal, in which a liquid crystal panel is incorporated.

In order to achieve the above-mentioned object, a first method for driving a piezoelectric transformer of the present invention is a method for driving a piezoelectric transformer in which a primary side electrode and a secondary side electrode are formed in a piezoelectric body, and a driving signal input from the primary side electrode is converted and output from the secondary side electrode to a load. The method includes the steps of detecting an output state to the load to generate a detection signal; and generating the driving signal for controlling a driving frequency and input power of the piezoelectric transformer based on the detection signal. The driving signal is a signal in a rectangular waveform having time periods up to an n-th (n is a natural number of 1 or more) time period in which a level is varied successively from a maximum potential and a minimum potential to an intermediate potential, obtained by respectively multiplying a period (T) of the driving signal by time ratios up to an n-th time ratio, a sum of the time ratios up to the n-th time ratio is set to be smaller than 0.5, and the time ratios up to the n-th time ratio are set so as to minimize a sum of ratios of values of respective higher order input currents with respect to a value of an input current with a frequency that excites the piezoelectric transformer.

In order to achieve the above-mentioned object, a second method for driving a piezoelectric transformer of the present invention is a method for driving a piezoelectric transformer in which a primary side electrode and a secondary side electrode are formed in a piezoelectric body, and a driving signal input from the primary side electrode is converted and output from the secondary side electrode to a load. The method includes the steps of detecting an output state to the load to generate a detection signal; and generating the driving signal for controlling a driving frequency and input power of the piezoelectric transformer based on the detection signal. The driving signal is a signal in a rectangular waveform having a time period ($\delta T$) in which a level is a maximum potential (2V) or a minimum potential (0), obtained by multiplying a period (T) of the driving signal by a predetermined time ratio ($\delta$), and the time ratio ($\delta$) is set to be smaller than 0.5 and so as to minimize a sum (R3) of ratios (R1, R2) of values (A3, A5) of respective higher order input currents with respect to a value (A1) of an input current with a frequency that excites the piezoelectric transformer.

In order to achieve the above-mentioned object, a third method for driving a piezoelectric transformer of the present invention is a method for driving a piezoelectric transformer in which a primary side electrode and a secondary side electrode are formed in a piezoelectric body, and a driving signal input from the primary side electrode is converted and output from the secondary side electrode to a load. The method includes the steps of detecting an output state to the load to generate a detection signal; and generating the driving signal for controlling a driving frequency and input power of the piezoelectric transformer based on the detection signal. The driving signal is a signal in a rectangular waveform having a first time period ($\delta_1 T$) in which a level is a maximum potential (2V) or a minimum potential (0), obtained by multiplying a period (T) of the driving signal by a first time ratio ($\delta_1$) and a second time period ($\delta_2 T$) in which a level is a potential ($\alpha_1 V$, $\alpha_2 V$) between the maximum potential and the minimum potential, obtained by multiplying a period (T) of the driving signal by a second time ratio ($\delta_2$), a sum of the first time ratio ($\delta_1$) and the second time ratio ($\delta_2$) is set to be smaller than 0.5, and the first time ratio ($\delta_1$) and the second time ratio ($\delta_2$) are set so as to minimize a sum (R13) of ratios (R11, R12) of values of respective higher order input currents with respect to a value of an input current with a frequency that excites the piezoelectric transformer.

In order to achieve the above-mentioned object, a fourth method for driving a piezoelectric transformer of the present invention is a method for driving a piezoelectric transformer in which a primary side electrode and a secondary side electrode are formed in a piezoelectric body, and a driving signal input from the primary side electrode is converted and output from the secondary side electrode to a load. The method includes the steps of detecting an output state to the load to generate a detection signal; and generating the driving signal for controlling a driving frequency and input power of the piezoelectric transformer based on the detection signal. The driving signal is a signal in a rectangular waveform having time periods up to an n-th (n is a natural number of 1 or more) time period in which a level is varied successively from a maximum potential and a minimum potential to an intermediate potential, obtained by respectively multiplying a period (T) of the driving signal by time ratios up to an n-th time ratio, a sum of the time ratios up to the n-th time ratio is set to be smaller than 0.5, and the time ratios up to the n-th time ratio are set so as to minimize a sum of ratios of amplitudes of respective higher order vibration modes with respect to an amplitude of a vibration mode that excites the piezoelectric transformer.

In order to achieve the above-mentioned object, a fifth method for driving a piezoelectric transformer of the present invention is a method for driving a piezoelectric transformer in which a primary side electrode and a secondary side electrode are formed in a piezoelectric body, and a driving signal input from the primary side electrode is converted and output from the secondary side electrode to a load. The method includes the steps of detecting an output state to the load to generate a detection signal; and generating the driving signal for controlling a driving frequency and input power of the piezoelectric transformer based on the detection signal. The driving signal is a signal in a rectangular waveform having a time period in which a level is a maximum potential (2V) or a minimum potential (0), obtained by multiplying a period (T) of the driving signal by a predetermined time ratio ($\delta$), and the time ratio ($\delta$) is set to be smaller than 0.5 and so as to minimize a sum (R3) of ratios (R1, R2) of amplitudes (A3, A5) of respective higher order vibration modes with respect to an amplitude (A1) of a vibration mode that excites the piezoelectric transformer.

In order to achieve the above-mentioned object, a sixth method for driving a piezoelectric transformer of the present invention is a method for driving a piezoelectric transformer in which a primary side electrode and a secondary side electrode are formed in a piezoelectric body, and a driving signal input from the primary side electrode is converted and output from the secondary side electrode to a load. The method includes the steps of detecting an output state to the load to generate a detection signal; and generating the driving signal for controlling a driving frequency and input power of the piezoelectric transformer based on the detection signal. The driving signal is a signal in a rectangular waveform having a first time period ($\delta_1 T$) in which a level is a maximum potential (2V) or a minimum potential (0), obtained by multiplying a period (T) of the driving signal by a first time ratio ($\delta_1$) and a second time period ($\delta_2 T$) in which a level is a potential ($\alpha_1 V$, $\alpha_2 V$) between the maximum potential and the minimum potential, obtained by multiplying a period (T) of the driving signal by a second time ratio ($\delta_2$), a sum of the first time ratio ($\delta_1$) and the second time ratio ($\delta_2$) is set to be smaller than 0.5, and the first time ratio ($\delta_1$) and the second time ratio ($\delta_2$) are set so as to minimize a sum (R13) of ratios (R11, R12) of amplitudes of respective higher order vibration modes with respect to an amplitude of a vibration mode that excites the piezoelectric transformer.

In order to achieve the above-mentioned object, a first driving circuit for a piezoelectric transformer of the present invention includes: a piezoelectric transformer in which a primary side electrode and a secondary side electrode are formed in a piezoelectric body, and a driving signal input from the primary side electrode is converted and output from the secondary side electrode to a load; a detection section for detecting an output state to the load to generate a detection signal; a control section for generating a control signal for controlling a driving frequency and input power of the piezoelectric transformer based on the detection signal output from the detection section; and a driving section for supplying the driving signal to the piezoelectric transformer based on the control signal output from the control section. The driving signal is a signal in a rectangular waveform having time periods up to an n-th (n is a natural number of 1 or more) time period in which a level is varied successively from a maximum potential and a minimum potential to an intermediate potential, obtained by respectively multiplying a period (T) of the driving signal by time ratios up to an n-th time ratio. The control section sets a sum of the time ratios up to the n-th time ratio to be smaller than 0.5, and sets the time ratios up to the n-th time ratio so as to minimize a sum of ratios of values of respective higher order input currents with respect to a value of an input current with a frequency that excites the piezoelectric transformer.

In order to achieve the above-mentioned object, a second driving circuit for a piezoelectric transformer of the present invention includes: a piezoelectric transformer in which a primary side electrode and a secondary side electrode are formed in a piezoelectric body, and a driving signal input from the primary side electrode is converted and output from the secondary side electrode to a load; a detection section for detecting an output state to the load to generate a detection signal; a control section for generating a control signal (S1, S2; S11, S12, S13, S14) for controlling a driving frequency and input power of the piezoelectric transformer based on the detection signal output from the detection section; and a driving section for supplying the driving signal (S3) to the piezoelectric transformer based on the control signal output from the control section, wherein the driving signal is a signal in a rectangular waveform having a time period ($\delta T$) in which a level is a maximum potential (2V; +V) or a minimum potential (0; –V), obtained by multiplying a period (T) of the driving signal by a predetermined time ratio ($\delta$). The driving section includes at least two switching elements. The control section controls a duty ratio of at least two control signals to be supplied to the switching elements or controls a phase of the other two control signals with respect to two control signals supplied to four switching elements, thereby setting the time ratio ($\delta$) to be smaller than 0.5 and so as to minimize a sum (R3) of ratios (R1, R2) of values (A3, A5) of respective higher order input currents with respect to a value (A1) of an input current with a frequency that excites the piezoelectric transformer.

In order to achieve the above-mentioned object, a third driving circuit for a piezoelectric transformer of the present invention includes: a piezoelectric transformer in which a primary side electrode and a secondary side electrode are formed in a piezoelectric body, and a driving signal input from the primary side electrode is converted and output from the secondary side electrode to a load; a detection section for detecting an output state to the load to generate a detection signal; a control section for generating a control signal for controlling a driving frequency and input power of the piezoelectric transformer based on the detection signal output from the detection section; and a driving section for supplying the driving signal to the piezoelectric transformer based on the control signal output from the control section. The driving signal is a signal in a rectangular waveform having a first time period ($\delta_1 T$) in which a level is a maximum potential (2V) or a minimum potential (0), obtained by multiplying a period (T) of the driving signal by a first time ratio ($\delta_1$) and a second time period ($\delta_2 T$) in which a level is a potential ($\alpha_1$, $\alpha_2$) between the maximum potential and the minimum potential, obtained by multiplying a period (T) of the driving signal by a second time ratio ($\delta_2$). The control section sets a sum of the first time ratio ($\delta_1$) and the second time ratio ($\delta_2$) to be smaller than 0.5, and sets the first time ratio ($\delta_1$) and the second time ratio ($\delta_2$) so as to minimize a sum of ratios of values of respective higher order input currents with respect to a value of an input current with a frequency that excites the piezoelectric transformer.

In order to achieve the above-mentioned object, a fourth driving circuit for a piezoelectric transformer of the present invention includes: a piezoelectric transformer in which a primary side electrode and a secondary side electrode are formed in a piezoelectric body, and a driving signal input from the primary side electrode is converted and output from the secondary side electrode to a load; a detection section for detecting an output state to the load to generate a detection signal; a control section for generating a control signal for controlling a driving frequency and input power of the piezoelectric transformer based on the detection signal output from the detection section; and a driving section for supplying the driving signal to the piezoelectric transformer based on the control signal output from the control section. The driving signal is a signal in a rectangular waveform having time periods up to an n-th (n is a natural number of 1 or more) time period in which a level is varied successively from a maximum potential and a minimum potential to an intermediate potential, obtained by respectively multiplying a period (T) of the driving signal by time ratios up to an n-th time ratio, and the control section sets a sum of the time ratios up to the n-th time ratio to be smaller than 0.5, and sets the time ratios up to the n-th time ratio so as to minimize a sum of ratios of amplitudes of respective higher order vibration modes with respect to an amplitude of a vibration mode that excites the piezoelectric transformer.

In order to achieve the above-mentioned object, a fifth driving circuit for a piezoelectric transformer of the present invention includes: a piezoelectric transformer in which a primary side electrode and a secondary side electrode are formed in a piezoelectric body, and a driving signal input from the primary side electrode is converted and output from the secondary side electrode to a load; a detection section for detecting an output state to the load to generate a detection signal; a control section for generating a control signal (S1, S2; S11, S12, S13, S14) for controlling a driving frequency and input power of the piezoelectric transformer based on the detection signal output from the detection section; and a driving section for supplying the driving signal (S3) to the piezoelectric transformer based on the control signal output from the control section. The driving signal is a signal in a rectangular waveform having a time period ($\delta$T) in which a level is a maximum potential (2V; +V) or a minimum potential (0; −V), obtained by multiplying a period (T) of the driving signal by a predetermined time ratio ($\delta$). The driving section includes at least two switching elements. The control section controls a duty ratio of at least two control signals to be supplied to the switching elements or controls a phase of the other two control signals with respect to two control signals to be supplied to four switching elements, thereby setting the time ratio ($\delta$) to be smaller than 0.5 and so as to minimize a sum of ratios of amplitudes of respective higher order vibration modes with respect to an amplitude of a vibration mode that excites the piezoelectric transformer.

In order to achieve the above-mentioned object, a sixth driving circuit for a piezoelectric transformer of the present invention includes: a piezoelectric transformer in which a primary side electrode and a secondary side electrode are formed in a piezoelectric body, and a driving signal input from the primary side electrode is converted and output from the secondary side electrode to a load; a detection section for detecting an output state to the load to generate a detection signal; a control section for generating a control signal for controlling a driving frequency and input power of the piezoelectric transformer based on the detection signal output from the detection section; and a driving section for supplying the driving signal to the piezoelectric transformer based on the control signal output from the control section. The driving signal is a signal in a rectangular waveform having a first time period ($\delta_1$T) in which a level is a maximum potential (2V) or a minimum potential (0), obtained by multiplying a period (T) of the driving signal by a first time ratio ($\delta_1$) and a second time period ($\delta_2$) in which a level is a potential ($\alpha_1$, $\alpha_2$) between the maximum potential and the minimum potential, obtained by multiplying a period (T) of the driving signal by a second time ratio ($\delta_2$). The control section sets a sum of the first time ratio ($\delta_1$) and the second time ratio ($\delta_2$) to be smaller than 0.5, and sets the first time ratio ($\delta_1$) and the second time ratio ($\delta_2$) so as to minimize a sum (R13) of ratios (R11, R12) of amplitudes of respective higher order vibration modes with respect to an amplitude of a vibration mode that excites the piezoelectric transformer.

In the first to sixth driving methods for a piezoelectric transformer, and the first to sixth driving circuits for a piezoelectric transformer of the present invention, the load is a cold-cathode tube.

In order to achieve the above-mentioned object, a first cold-cathode tube light-emitting apparatus of the present invention includes: a piezoelectric transformer in which a primary side electrode and a secondary side electrode are formed in a piezoelectric body, and a driving signal input from the primary side electrode is converted and output from the secondary side electrode; a cold-cathode tube connected to the secondary side electrode of the piezoelectric transformer; a detection section for detecting an output state to the cold-cathode tube to generate a detection signal; a control section for generating a control signal for controlling a driving frequency and input power of the piezoelectric transformer based on the detection signal output from the detection section; and a driving section for supplying the driving signal to the piezoelectric transformer based on the control signal output from the control section. The driving signal is a signal in a rectangular waveform having time periods up to an n-th (n is a natural number of 1 or more) time period in which a level is varied successively from a maximum potential and a minimum potential to an intermediate potential, obtained by respectively multiplying a period (T) of the driving signal by time ratios up to an n-th time ratio. The control section sets a sum of the time ratios up to the n-th time ratio to be smaller than 0.5 and sets the time ratios up to the n-th time ratio so as to minimize a sum of ratios of values of respective higher order input currents with respect to a value of an input current with a frequency that excites the piezoelectric transformer, and generates the control signal based on the set time ratios up to the n-th time ratio.

In order to achieve the above-mentioned object, a second cold-cathode tube light-emitting apparatus of the present invention includes: a piezoelectric transformer in which a primary side electrode and a secondary side electrode are formed in a piezoelectric body, and a driving signal input from the primary side electrode is converted and output from the secondary side electrode; a cold-cathode tube connected to the secondary side electrode of the piezoelectric transformer; a detection section for detecting an output state to the cold-cathode tube to generate a detection signal; a control section for generating a control signal for controlling a driving frequency and input power of the piezoelectric transformer based on the detection signal output from the detection section; and a driving section for supplying the driving signal to the piezoelectric transformer based on the control signal output from the control section. The driving signal is a signal in a rectangular waveform having a time period ($\delta T$) in which a level is a maximum potential (2V; +V) or a minimum potential (0; −V), obtained by multiplying a period (T) of the driving signal by a predetermined time ratio ($\delta$). The control section sets the time ratio ($\delta$) to be smaller than 0.5 and so as to minimize a sum (R3) of ratios (R1, R2) of values (A3, A5) of respective higher order input currents with respect to a value (A1) of an input current of a frequency that excites the piezoelectric transformer, and generates the control signal based on the set time ratio.

In order to achieve the above-mentioned object, a third cold-cathode tube light-emitting apparatus of the present invention includes: a piezoelectric transformer in which a primary side electrode and a secondary side electrode are formed in a piezoelectric body, and a driving signal input from the primary side electrode is converted and output from the secondary side electrode; a cold-cathode tube connected to the secondary side electrode of the piezoelectric transformer; a detection section for detecting an output state to the cold-cathode tube to generate a detection signal; a control section for generating a control signal for controlling a driving frequency and input power of the piezoelectric transformer based on the detection signal output from the detection section; and a driving section for supplying the driving signal to the piezoelectric transformer based on the control signal output from the control section. The driving signal is a signal in a rectangular waveform having a first time period ($\delta_1 T$) in which a level is a maximum potential (2V) or a minimum potential (0), obtained by multiplying a period (T) of the driving signal by a first time ratio ($\delta_1$) and a second time period ($\delta_2 T$) in which a level is a potential ($\alpha_1$, $\alpha_2$) between the maximum potential and the minimum potential, obtained by multiplying a period (T) of the driving signal by a second time ratio ($\delta_2$). The control section sets a sum of the first time ratio ($\delta_1$) and the second time ratio ($\delta_2$) to be smaller than 0.5 and sets the first time ratio ($\delta_1$) and the second time ratio ($\delta_2$) so as to minimize a sum of ratios of values of respective higher order input currents with respect to a value of an input current with a frequency that excites the piezoelectric transformer, and generates the control signal based on the set first time ratio ($\delta_1$) and the set second time ratio ($\delta_2$).

In order to achieve the above-mentioned object, a fourth cold-cathode tube light-emitting apparatus of the present invention includes: a piezoelectric transformer in which a primary side electrode and a secondary side electrode are formed in a piezoelectric body, and a driving signal input from the primary side electrode is converted and output from the secondary side electrode; a cold-cathode tube connected to the secondary side electrode of the piezoelectric transformer; a detection section for detecting an output state to the cold-cathode tube to generate a detection signal; a control section for generating a control signal for controlling a driving frequency and input power of the piezoelectric transformer based on the detection signal output from the detection section; and a driving section for supplying the driving signal to the piezoelectric transformer based on the control signal output from the control section. The driving signal is a signal in a rectangular waveform having time periods up to an n-th (n is a natural number of 1 or more) time period in which a level is varied successively from a maximum potential and a minimum potential to an intermediate potential, obtained by respectively multiplying a period (T) of the driving signal by time ratios up to an n-th time ratio. The control section sets a sum of the time ratios up to the n-th time ratio to be smaller than 0.5 and sets the time ratios up to the n-th time ratio so as to minimize a sum of ratios of amplitudes of respective higher order vibration modes with respect to an amplitude of a vibration mode that excites the piezoelectric transformer, and generates the control signal based on the set time ratios up to the n-th time ratio.

In order to achieve the above-mentioned object, a fifth cold-cathode tube light-emitting apparatus of the present invention includes: a piezoelectric transformer in which a primary side electrode and a secondary side electrode are formed in a piezoelectric body, and a driving signal input from the primary side electrode is converted and output from the secondary side electrode; a cold-cathode tube connected to the secondary side electrode of the piezoelectric transformer; a detection section for detecting an output state to the cold-cathode tube to generate a detection signal; a control section for generating a control signal for controlling a driving frequency and input power of the piezoelectric transformer based on the detection signal output from the detection section; and a driving section for supplying the driving signal to the piezoelectric transformer based on the control signal output from the control section. The driving signal is a signal in a rectangular waveform having a time period ($\delta T$) in which a level is a maximum potential (2V; +V) or a minimum potential (0; −V), obtained by multiplying a period (T) of the driving signal by a predetermined time ratio ($\delta$). The control section sets the time ratio ($\delta$) to be smaller than 0.5 and so as to minimize a sum (R3) of ratios (R1, R2) of amplitudes (A3, A5) of respective higher order vibration modes with respect to an amplitude (A1) of a vibration mode that excites the piezoelectric transformer, and generates the control signal based on the set time ratio ($\delta$).

In order to achieve the above-mentioned object, a sixth cold-cathode tube light-emitting apparatus of the present invention includes: a piezoelectric transformer in which a primary side electrode and a secondary side electrode are formed in a piezoelectric body, and a driving signal input from the primary side electrode is converted and output from the secondary side electrode; a cold-cathode tube connected to the secondary side electrode of the piezoelectric transformer; a detection section for detecting an output state to the cold-cathode tube to generate a detection signal; a control section for generating a control signal for controlling a driving frequency and input power of the piezoelectric transformer based on the detection signal output from the detection section; and a driving section for supplying the driving signal to the piezoelectric transformer based on the control signal output from the control section. The driving signal is a signal in a rectangular waveform having a first time period ($\delta_1 T$) in which a level is a maximum potential (2V) or a minimum potential (0), obtained by multiplying a period (T) of the driving signal by a first time ratio ($\delta_1$) and a second time period ($\delta_2 T$) in which a level is a second time period ($\alpha_1 V$, $\alpha_2 V$) that is a potential between the maximum potential and the minimum potential, obtained by multiplying a period (T) of the driving signal by a second time ratio ($\delta_2$). The control section sets a sum of the first time ratio ($\delta_1$) and the second time ratio ($\delta_2$) to be smaller than 0.5 and sets the first time ratio ($\delta_1$) and the second time ratio ($\delta_2$) so as to minimize a sum (R13) of ratios (R11, R12) of amplitudes of respective higher order vibration modes with respect to an amplitude of a vibration mode that excites the piezoelectric transformer, and generates the control signal based on the set first time ratio ($\delta_1$) and the set second time ratio ($\delta_2$).

In order to achieve the above-mentioned object, a liquid crystal panel of the present invention includes any of the above-mentioned first to sixth cold-cathode tube light-emitting apparatuses, and has a brightness controlled by the cold-cathode tube light-emitting apparatus.

In order to achieve the above-mentioned object, a device with a built-in liquid crystal panel of the present invention incorporates the liquid crystal panel of the present invention.

According to the first to third driving methods and driving circuits of a piezoelectric transformer, by suppressing an input current value of a harmonic component other than a driving frequency, included in the driving signal of the piezoelectric transformer, without using an inductive element, the driving efficiency of the piezoelectric transformer can be enhanced, and electromagnetic noise can be suppressed.

According to the fourth to sixth driving methods and driving circuits of a piezoelectric transformer, by suppressing a higher order vibration mode excited by a harmonic component other than a driving frequency, included in the driving signal of the piezoelectric transformer, without using an inductive element, the reliability of the piezoelectric transformer due to withstand power and distortion can be enhanced.

By including a cold-cathode tube light-emitting apparatus for controlling the light emission of a cold-cathode tube by the above-mentioned driving circuit of the piezoelectric transformer in a liquid crystal panel, and incorporating the liquid crystal panel in a device such as a mobile telephone and a communication terminal, the device can be miniaturized, and its reliability can be enhanced.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of preferred embodiments with reference to the drawings.

Embodiment 1

Figure 1:
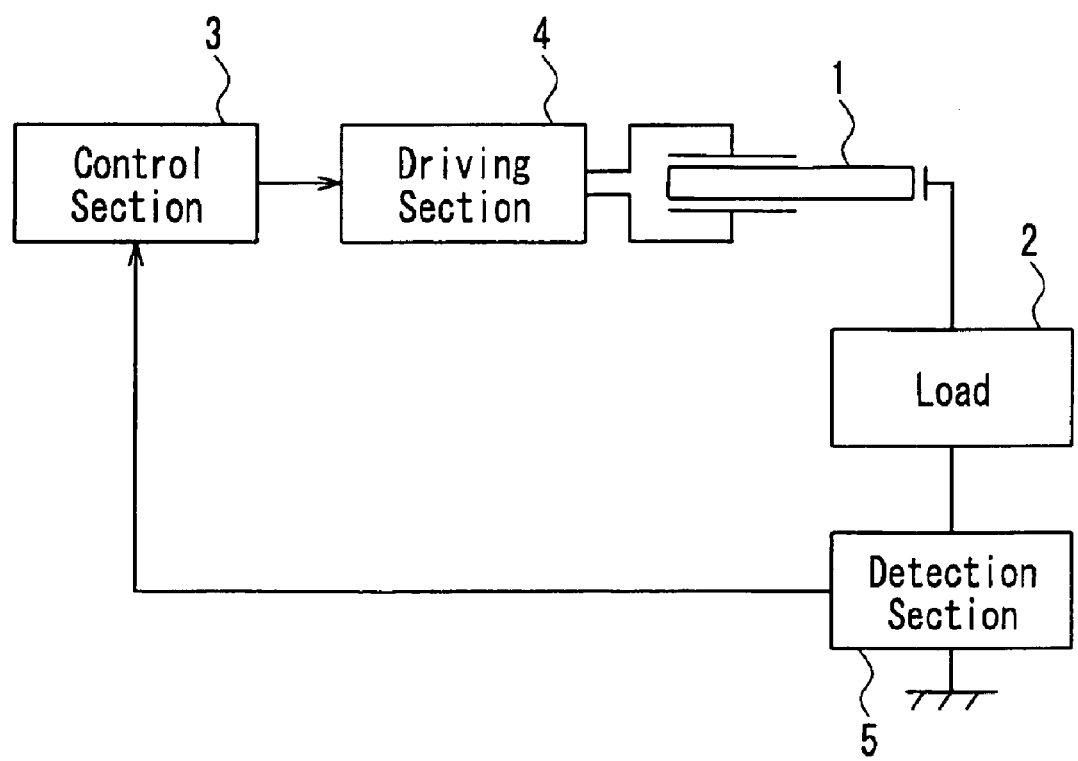
FIG. 1 is a block diagram showing an exemplary configuration of a piezoelectric transformer driving circuit according to Embodiment 1 of the present invention.

FIG. 1 is a block diagram showing an exemplary configuration of a driving circuit for a piezoelectric transformer according to Embodiment 1 of the present invention. In FIG. 1, reference numeral 1 denotes a piezoelectric transformer, 2 denotes a load, 3 denotes a control section, 4 denotes a driving section, and 5 denotes a detection section.

Figure 2A:
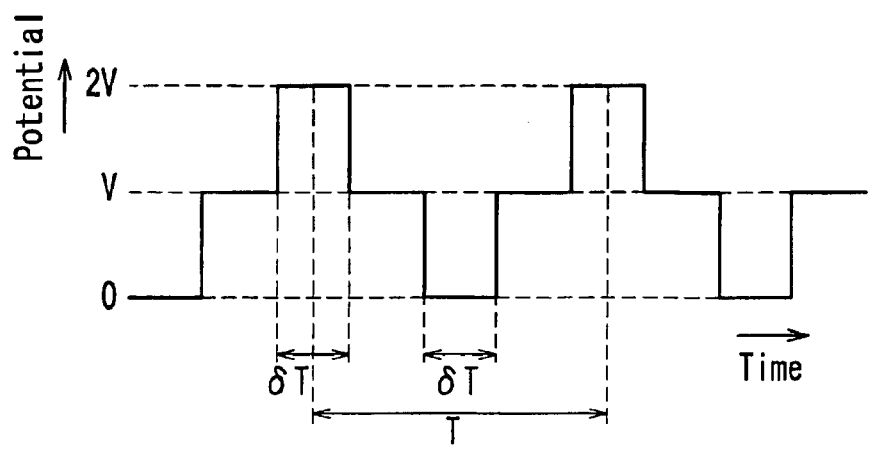
FIG. 2A is a waveform diagram showing an example of a driving signal in a rectangular waveform applied from a driving section 4 to a piezoelectric transformer 1 in FIG. 1.

FIG. 2A is a waveform diagram showing an example of a driving signal in a rectangular waveform applied from the driving section 4 to the piezoelectric transformer 1. In FIG. 2A, a period T of the driving signal in a rectangular waveform corresponds to a reciprocal of a driving frequency of the piezoelectric transformer 1, and a time period in which the potential of the driving signal is a maximum potential (2V) or a minimum potential (0) is set to be δT. V denotes an intermediate potential. More specifically, δ represents a time ratio at which the level of the driving signal is a maximum potential or a minimum potential, with respect to the period T of the driving signal.

Figure 2B:
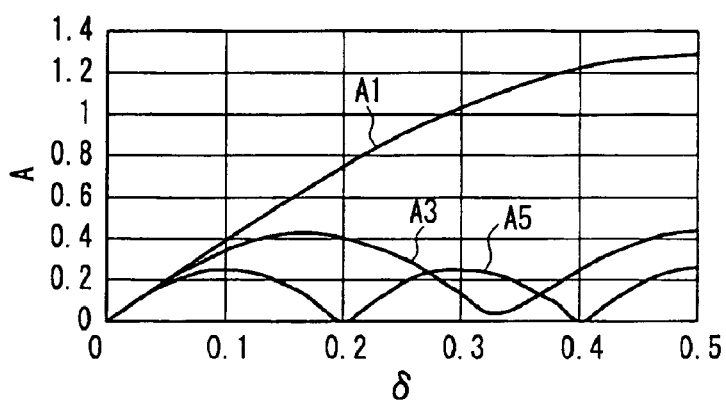
FIG. 2B is a graph showing a change in an amplitude A in each vibration mode calculated from a frequency component by Fourier transformation, with respect to a change in a time ratio δ shown in FIG. 2A.

FIG. 2B is a graph showing a change in an amplitude A in each vibration mode calculated from a frequency component by Fourier Transformation, with respect to a change in the time ratio δ shown in FIG. 2A. In FIG. 2B, A1 represents a change in the amplitude A of a first order (basic) vibration mode that excites the piezoelectric transformer, with respect to a change in the time ratio δ,; A3 represents a change in the amplitude A of a third order vibration mode with respect to a change in the time ratio δ; and A5 represents a change in the amplitude A of a fifth order vibration mode with respect to a change in the time ratio δ.

Figure 2C:
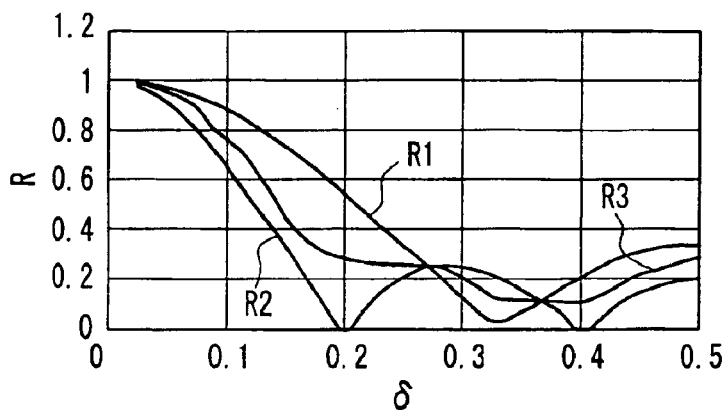
FIG. 2C is a graph showing a ratio R1 of an amplitude A3 in a third order vibration mode and a ratio R2 of an amplitude A5 in a fifth order vibration mode with respect to an amplitude A1 in a first order vibration mode shown in FIG. 2B, and a value R3 obtained by normalizing a sum of R1 and R2.

FIG. 2C is a graph showing a ratio R1 of an amplitude A3 of a third order vibration mode that is higher than the first order vibration mode and a ratio R2 of an amplitude A5 of a fifth order vibration mode that is higher than the first order vibration mode, with respect to the amplitude A1 of the first order vibration mode shown in FIG. 2B, and a value R3 obtained by normalizing a sum of R1 and R2.

As shown in FIG. 2C, R3 becomes minimum when the time ratio δ is in the vicinity of 0.4 (40%). Therefore, when the time ratio δ is set to be in the vicinity of 0.4, frequency components in the third order vibration mode and fifth order vibration mode can be decreased, compared with the case where δ is 0.5 (the duty ratio of the driving signal in a rectangular waveform applied to the piezoelectric transformer 1 is 0.5).

Next, the operation of the driving circuit for the piezoelectric transformer 1 will be described, based on the time ratio δ obtained as described above.

In FIG. 1, the driving frequency and applied voltage (potential V in FIG. 2A) of the piezoelectric transformer 1 are set in the control section 3. A control signal is generated based on the time ratio δ obtained as shown in FIG. 2C. In accordance with the control signal, the driving section 4 supplies power to a primary side electrode of the piezoelectric transformer 1 in a voltage waveform with an amplitude shape as shown in FIG. 2A. The power supplied from the driving section 4 is stepped-up by the piezoelectric transformer 1 to be output, whereby the load 2 is supplied with the power. The detection section 5 detects an output state of the load 2, and sends a detection signal in accordance with the output state to the control section 3. The control section 3 controls the driving frequency or the applied voltage so that the output state of the load 2 is constant or varied, based on the detection signal from the detection section 5.

In the case of using a cold-cathode tube as the load 2 in a circuit composed of elements having the above-mentioned functions, the cold-cathode tube has a high impedance of hundreds of MΩ or higher until it starts lighting up, and the impedance of the cold-cathode tube is rapidly decreased to hundreds of kΩ during lighting. Consequently, the frequency characteristics of the resonance frequency and the voltage step-up ratio of the piezoelectric transformer 1 are varied. Therefore, the control section 3 can control the lighting of the cold-cathode tube and the brightness during lighting by setting the driving frequency and the applied voltage in accordance with the lighting state of the cold-cathode tube, i.e., a change in impedance.

As described above, according to the present embodiment, by suppressing a higher order vibration mode that is excited by a harmonic component other than a driving frequency, included in the driving signal of the piezoelectric transformer, without using an inductive element, a driving efficiency and the reliability in terms of withstand power and distortion of the piezoelectric transformer can be enhanced.

Furthermore, it is not necessarily required that the driving circuit of the present embodiment is realized with the components shown in FIG. 1, and other components may be used as long as they achieve the same functions as those in FIG. 1.

In the present embodiment, regarding the value of the time ratio δ, the case has been described in which the piezoelectric transformer is excited in a first order vibration mode, considering the influence of a third order vibration mode and a fifth order vibration mode with respect to the first order vibration mode. According to the present invention, the influence of higher order modes is not limited to the consideration up to the fifth order vibration mode.

In addition, the vibration mode for exciting the piezoelectric transformer is not limited to a first order vibration mode. If the value of the time ratio δ is set, considering the influence of a vibration mode higher than the vibration mode that excites the piezoelectric transformer, the same effects can be obtained.

Furthermore, the driving frequency and driving voltage of the piezoelectric transformer 1 may be set in the control section 3 based on the detection signal from the detection section 5 in FIG. 1, by software processing using a microcomputer, peripheral equipment such as a data accumulation apparatus (e.g., a memory), or the like. Furthermore, the driving section 4 may be composed of a D/A converter or the like for outputting the driving voltage waveform as shown in FIG. 2A, an amplifier such as an operational amplifier, and the like.

Embodiment 2

Figure 3:
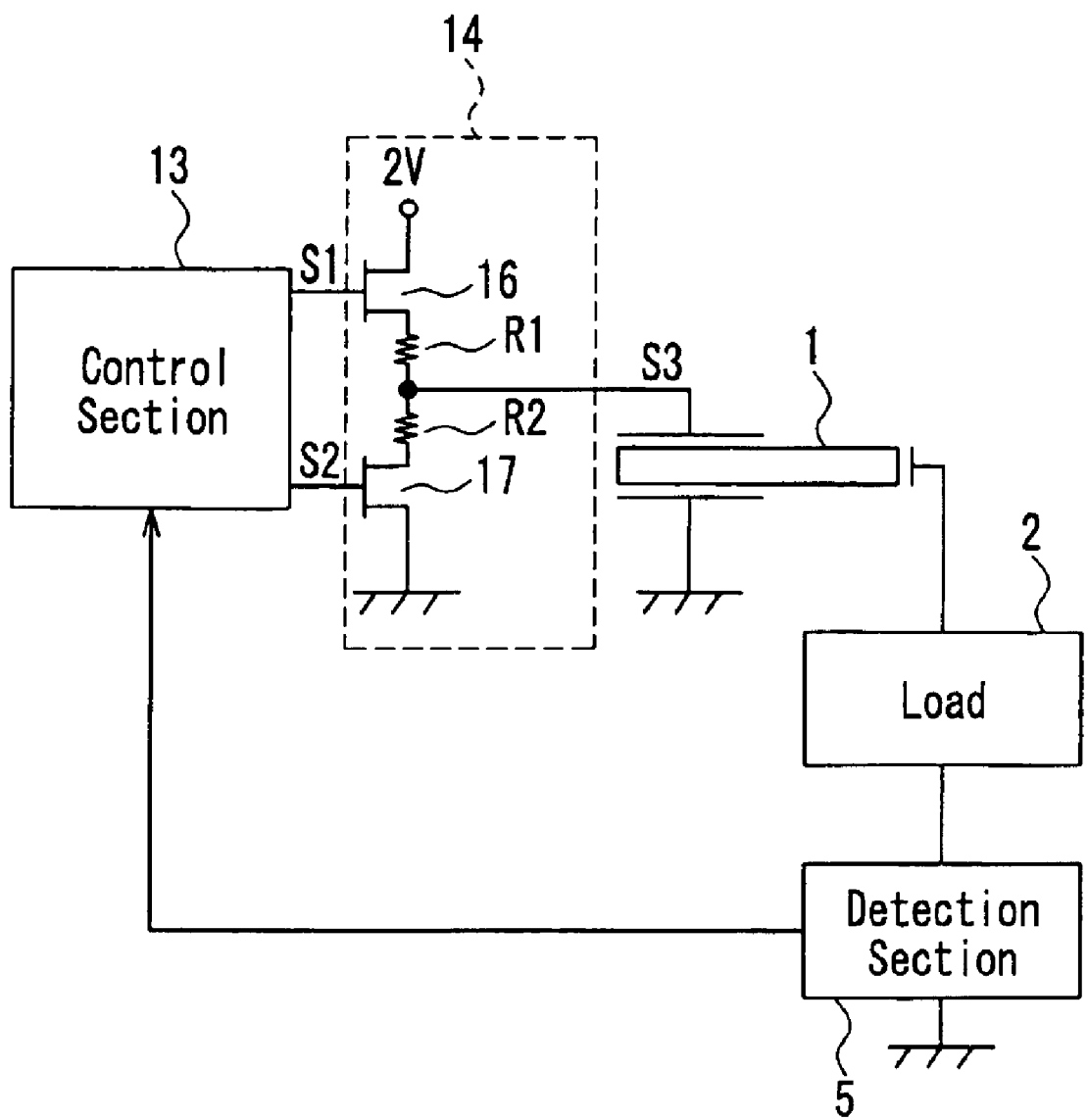
FIG. 3 is a block diagram showing an exemplary configuration of a piezoelectric transformer driving circuit according to Embodiment 2 of the present invention.

FIG. 3 is a block diagram showing an exemplary configuration of a driving circuit for a piezoelectric transformer according to Embodiment 2 of the present invention. In FIG. 3, the components having the same configurations and functions as those in Embodiment 1 shown in FIG. 1 are denoted with the same reference numerals as those therein, and the description thereof will be omitted here.

In FIG. 3, a driving section 14 has a configuration in which a first switching element 16, a second switching element 17, a resistor R1, and a resistor R2 are connected in series to each other. One primary side electrode of the piezoelectric transformer 1 is grounded. A gate of the first switching element 16 is supplied with a first control signal S1 from a control section 13, and a gate of the second switching element 17 is supplied with a second control signal S2 from the control section 13. A driving signal S3 is output from a common connection portion of the resistors R1 and R2.

Figure 4:
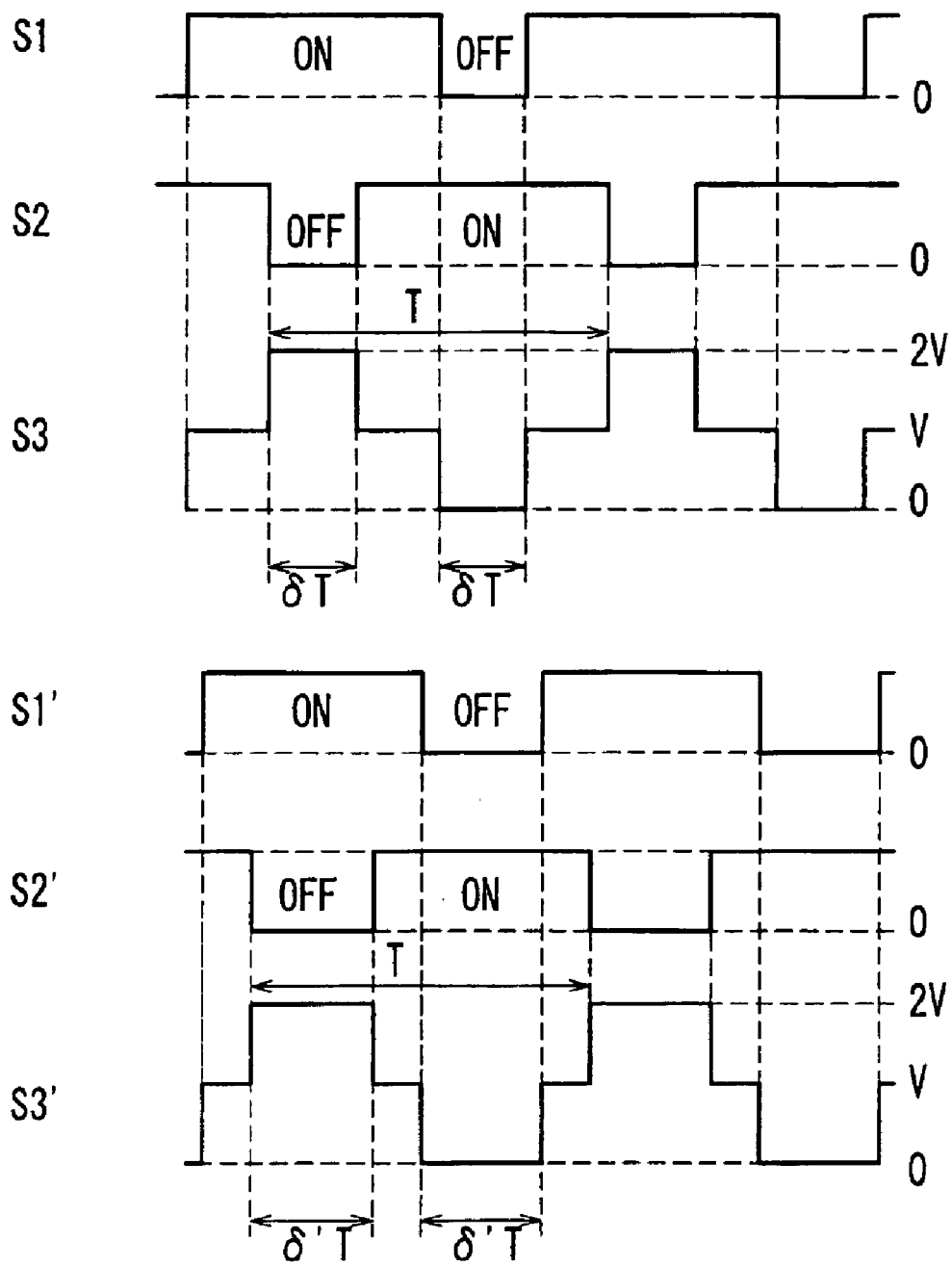
FIG. 4 is a timing chart of a signal in each section in the driving circuit shown in FIG. 3.

Next, the operation of the driving circuit for the piezoelectric transformer thus configured will be described with reference to FIG. 4 as well as FIG. 3. FIG. 4 is a timing chart of a signal in each section in the driving circuit shown in FIG. 3. In FIG. 4, "ON" and "OFF" represent that the first switching element 16 is in an ON state and an OFF state due to first control signals S1 and S1', and the second switching element 17 is in an ON state and an OFF state due to second control signals S2 and S2'.

When the first control signal S1 is applied to the first switching element 16 and the second control signal S2 is applied to the second switching element 17 from the control section 13 in a timing relationship shown in FIG. 4, the primary side electrode of the piezoelectric transformer 1 is supplied with a driving signal S3 having a voltage waveform in which the time period of a maximum potential 2V is δT, the time period of an intermediate potential V is (1–2δ)T, and the time period of a minimum potential 0 is δT.

Furthermore, when the first control signal S1' having a duty ratio and a phase different from those of S1 is applied to the first switching element 16, and the second control signal S2' having a duty ratio and a phase different from those of S2 is applied to the second switching element 17 from the control section 13, the primary side electrode of the piezoelectric transformer 1 is supplied with a driving signal S3' having a voltage waveform in which the time period of a maximum potential 2V is δ'T, the time period of an intermediate potential V is (1–2δ')T, and the time period of a minimum potential 0 is δ'T.

As shown in FIG. 4, by changing the duty ratio of the first control signal and the second control signal, the voltage waveform of a driving signal applied to the piezoelectric transformer 1 can be varied.

In the same way as in Embodiment 1, in the control section 13, the driving frequency and applied voltage (the intermediate potential V in FIG. 4) of the piezoelectric transformer 1 are set. The first control signal S1 and the second control signal S2 as shown in FIG. 4 are generated based on the time ratio δ obtained as shown in FIG. 2C. Based on the first control signal S1 and the second control signal S2, the driving section 13 supplies power to the primary side electrode of the piezoelectric transformer 1 in a voltage waveform with an amplitude shape as shown in FIG. 4. The power supplied from the driving section 14 is stepped-up by the piezoelectric transformer 1 to be output, whereby the load 2 is supplied with the power. The detection section 5 detects the output state of the load 2, and sends a detection signal in accordance with the output state to the control section 13. The control section 13 controls the driving frequency or applied voltage so that the output state of the load 2 is constant or varied, based on the detection signal from the detection section 5.

In the case of using a cold-cathode tube as the load 2 in a circuit composed of elements having the above-mentioned functions, in the same way as in Embodiment 1, the control section 13 sets the driving frequency and applied voltage in accordance with the lighting state of the cold-cathode tube, i.e., the change in impedance, whereby the control section 13 can control the lighting of the cold cathode-tube and the brightness during lighting.

As described above, according to the present embodiment, by suppressing a higher order vibration mode that is excited by a harmonic component other than a driving frequency, included in the driving signal of the piezoelectric transformer, without using an inductive element, a driving efficiency and the reliability in terms of withstand power and distortion of the piezoelectric transformer can be enhanced. Furthermore, with a simple configuration, the driving circuit for the piezoelectric transformer can be realized.

Figure 5:
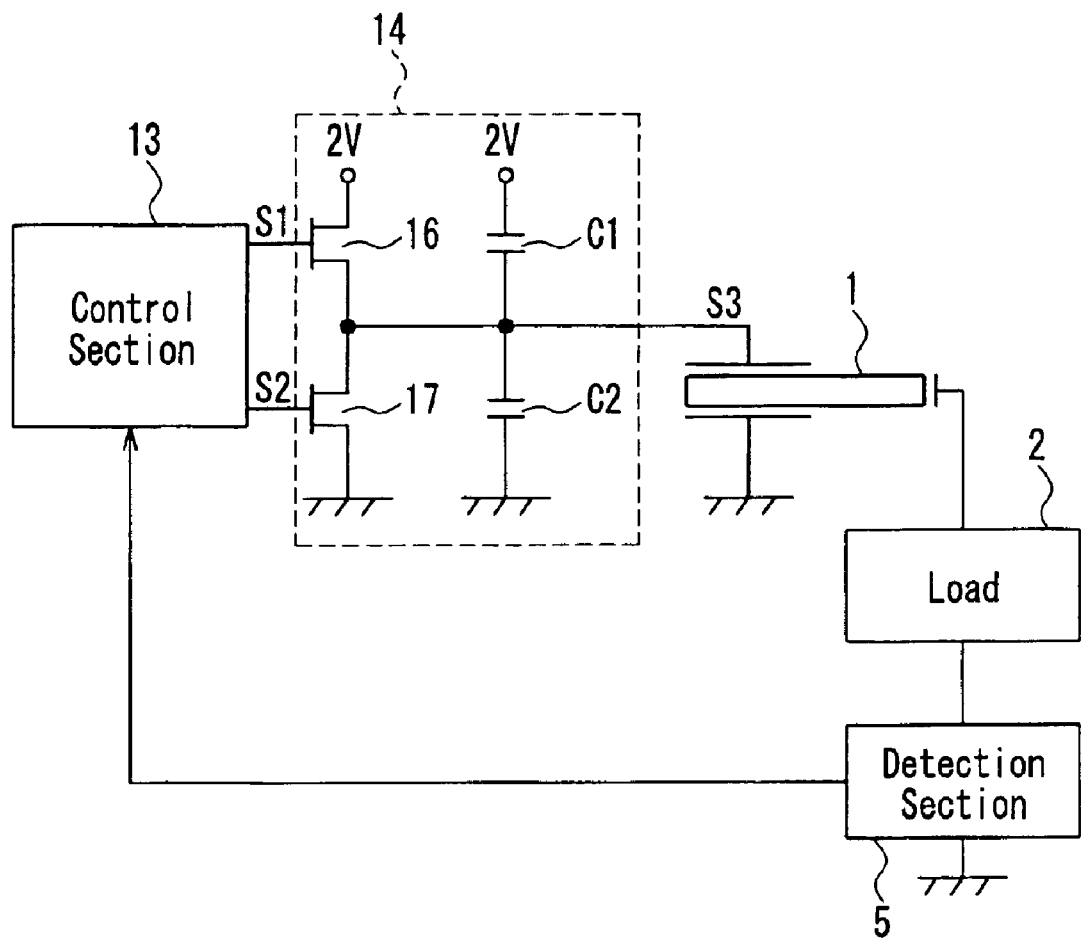
FIG. 5 is a block diagram showing a modified example of the piezoelectric transformer driving circuit according to Embodiment 2 of the present invention.
Figure 6:
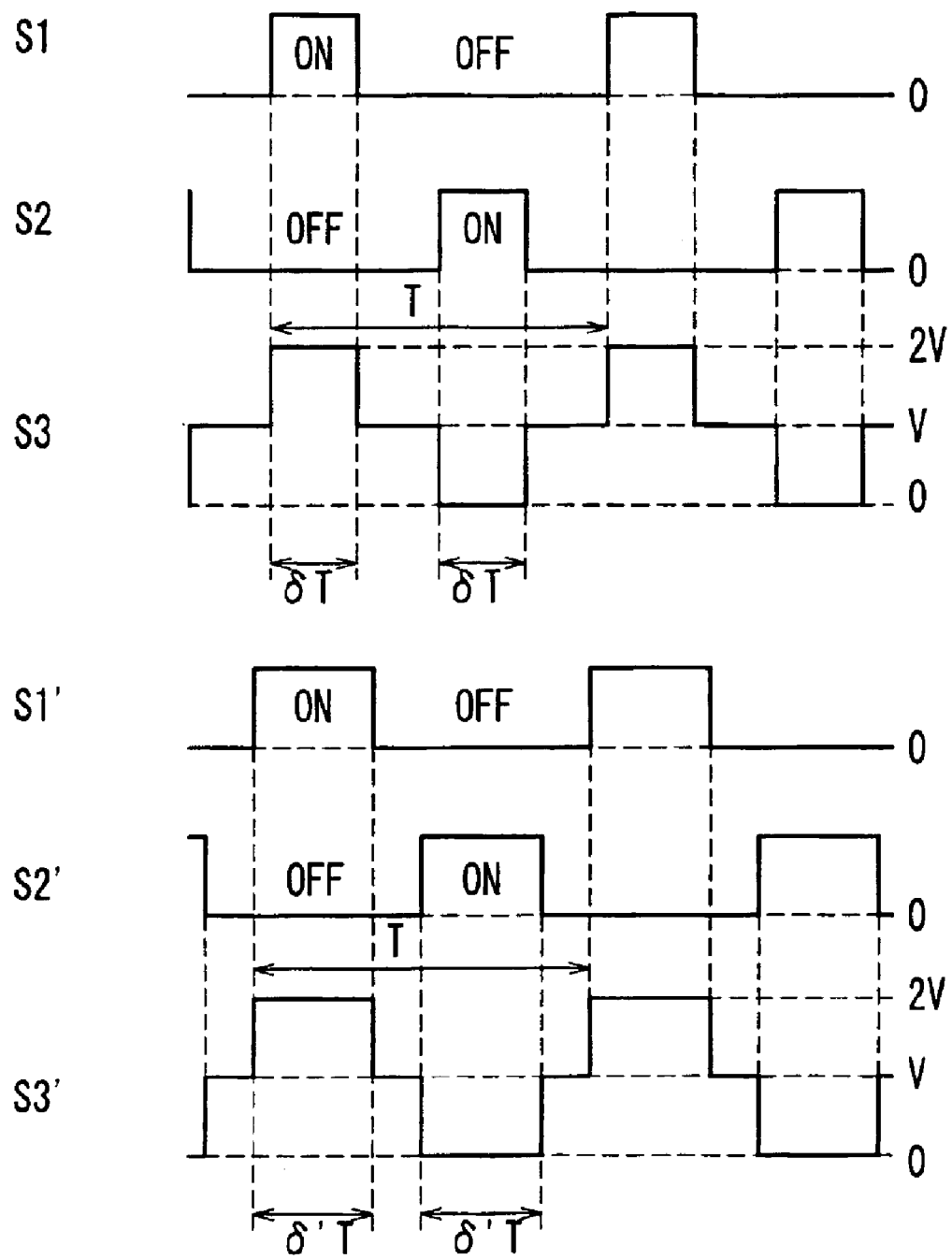
FIG. 6 is a timing chart of a signal in each section in the driving circuit shown in FIG. 5.

Even with the configuration shown in FIG. 5, instead of the configuration shown in FIG. 3, the driving section 14 has the same effects. In a modified example shown in FIG. 5, the driving section 14 has a configuration in which a first series connection body is connected in parallel to a second series connection body. In the first series connection body, the first switching element 16 and the second switching element 17 are connected in series to each other, and in the second series connection body, a capacitor C1 and a capacitor C2 are connected in series to each other. In this case, a timing relationship between the first control signals S1, S1' and the second control signals S2, S2' is as shown in FIG. 6.

Embodiment 3

Figure 7:
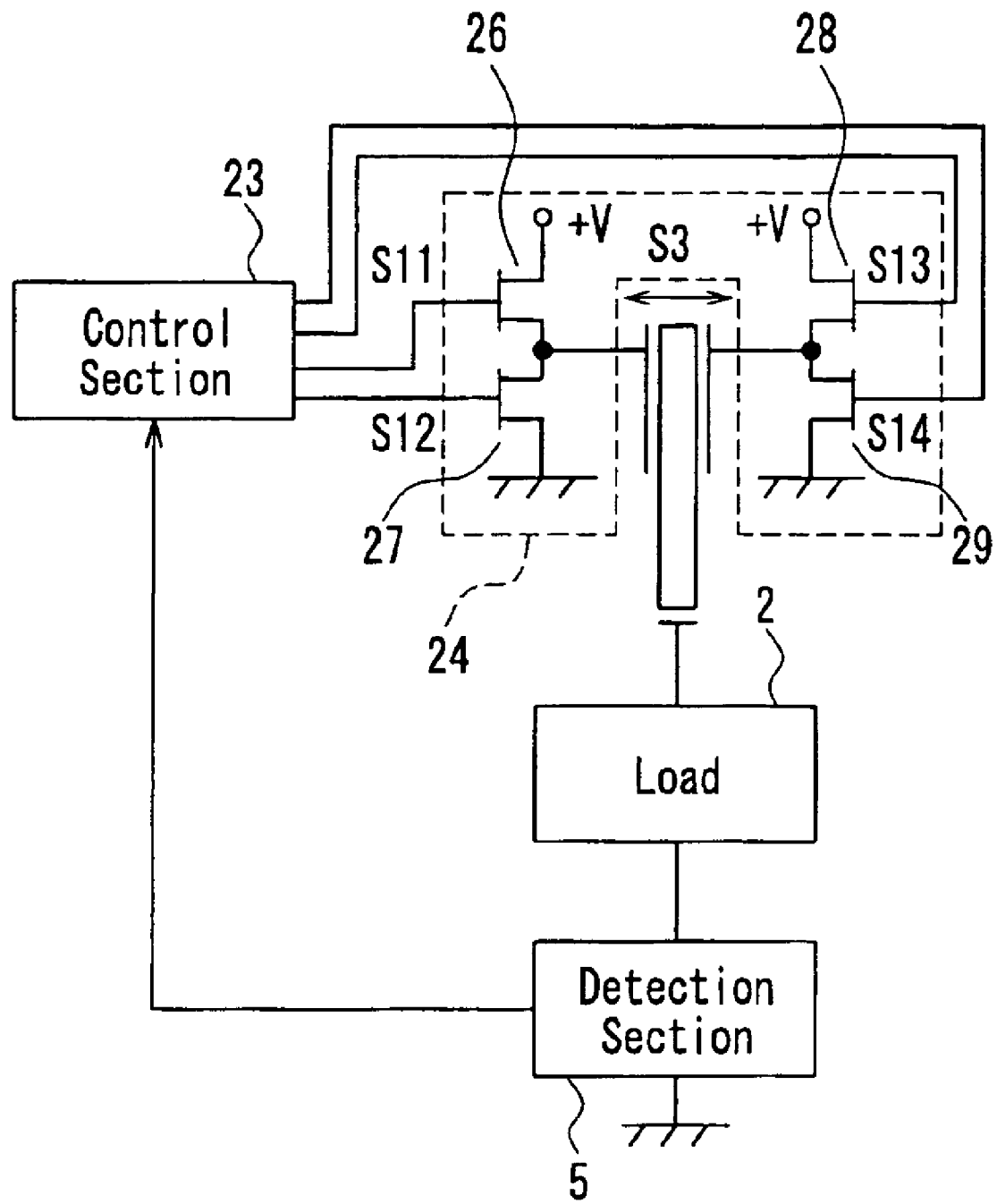
FIG. 7 is a block diagram showing an exemplary configuration of a piezoelectric transformer driving circuit according to Embodiment 3 of the present invention.

FIG. 7 is a block diagram showing an exemplary configuration of a driving circuit for a piezoelectric transformer according to Embodiment 3 of the present invention. In FIG. 7, the components having the same configurations and functions as those in Embodiment 1 shown in FIG. 1 are denoted with the same reference numerals as those therein, and the description thereof will be omitted here.

In FIG. 7, a driving section 24 is composed of a first series connection body in which a first switching element 26 and a second switching element 27 are connected in series, and a second series connection body in which a third switching element 28 and a fourth switching element 29 are connected in series. A common connection portion (an output portion of the first series connection body) between the first switching element 26 and the second switching element 27 is connected to one primary side electrode of the piezoelectric transformer 1. A common connection portion (an output portion of the second series connection body) between the third switching element 28 and the fourth switching element 29 is connected to the other primary side electrode of the piezoelectric transformer 1.

A gate of the first switching element 26 is supplied with a first control signal S11 from a control section 23, and a gate of the second switching element 27 is supplied with a second control signal S12 from the control section 23. A gate of the third switching element 28 is supplied with a third control signal S13 from the control section 23, and a gate of the fourth switching element 29 is supplied with a fourth control signal S14 from the control section 23. A driving signal S3 is applied between the primary side electrodes of the piezoelectric transformer 1

Figure 8:
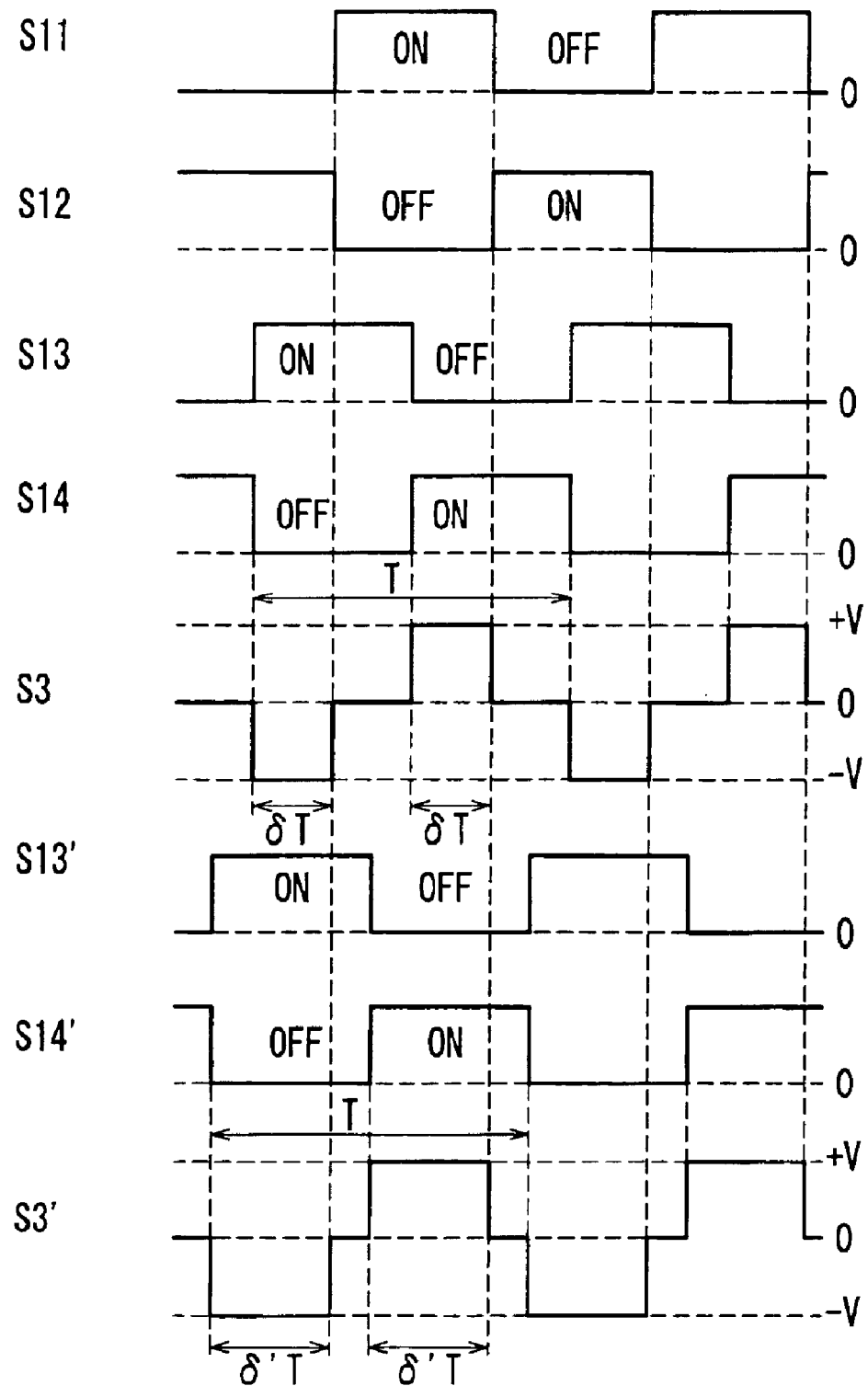
FIG. 8 is a timing chart of a signal in each section in the driving circuit shown in FIG. 7.

Next, the operation of the driving circuit for the piezoelectric transformer thus configured will be described with reference to FIG. 8 as well as FIG. 7. FIG. 8 is a timing chart of a signal in each section in the driving circuit shown in FIG. 7. In FIG. 8, "ON" and "OFF" represent that the first switching element 26 is in an ON state and an OFF state due to the first control signal S11, the second switching element 27 is in an ON state and an OFF state due to the second control signal S12, the third switching element 28 is in an ON state and an OFF state due to the third control signals S13, S13', and the fourth switching element 29 is in an ON state and an OFF state due to the fourth control signals S14, S14'.

When the first control signal S11 is applied to the gate of the first switching element 26, the second control signal S12 is applied to the gate of the second switching element 27, the third control signal S13 is applied to the gate of the third switching element 28, and the fourth control signal S14 is applied to the gate of the fourth switching element 29 from the control section 23 in a timing relationship shown in FIG. 8, a portion between the primary side electrodes of the piezoelectric transformer 1 is supplied with a driving signal S3 having a voltage waveform in which the time period of a maximum potential +V is δT, the time period of an intermediate potential 0 is (1–2δ)T, and the time period of a minimum potential –V is δT. Herein, the first control signal S11 and the second control signal S12 have a logic inverted relationship, and the third control signal S13 and the fourth control signal S14 have a logic inverted relationship. Furthermore, the third control signal S13 and the fourth control signal S14 have a phase difference with respect to the first control signal S11 and the second control signal S12.

Furthermore, when the first control signal S11 is applied to the gate of the first switching element 26, the second control signal S12 is applied to the gate of the second switching element 27, the third control signal S13' having a phase different from that of S13 is applied to the gate of the third switching element 28, and the fourth control signal S14' having a phase different from that of S14 is applied to the gate of the fourth switching element 29 from the control section 23, a portion between the primary side electrodes of the piezoelectric transformer 1 is supplied with the driving signal S3' having a voltage waveform in which the time period of a maximum potential +V is δ'T, the time period of an intermediate potential 0 is (1−2δ')T, and the time period of a minimum potential −V is δ'T.

As shown in FIG. 8, by changing the phases of the third and fourth control signals with respect to the first and second control signals, the voltage waveform of the driving signal applied to the piezoelectric transformer 1 can be varied.

In the same way as in Embodiment 1, in the control section 23, the driving frequency and applied voltage (the potential V in FIG. 8) of the piezoelectric transformer 1 are set. The first control signal S11, the second control signal S12, the third control signal S13, and the fourth control signal S14 as shown in FIG. 8 are generated based on the time ratio δ obtained as shown in FIG. 2C. Based on the control signals S11, S12, S13, and S14, the driving section 24 supplies power to a portion between the primary side electrodes of the piezoelectric transformer 1 in a voltage waveform with an amplitude shape as shown in FIG. 8. The power supplied from the driving section 24 is stepped-up by the piezoelectric transformer 1 to be output, whereby the load 2 is supplied with the power. The detection section 5 detects the output state of the load 2, and sends a detection signal in accordance with the output state to the control section 23. The control section 23 controls the driving frequency or applied voltage so that the output state of the load 2 is constant or varied, based on the detection signal from the detection section 5.

In the case of using a cold-cathode tube as the load 2 in a circuit composed of elements having the above-mentioned functions, the control section 23 sets the driving frequency and applied voltage in accordance with the lighting state of the cold-cathode tube, i.e., the change in impedance, whereby the control section 23 can control the lighting of the cold cathode-tube and the brightness during lighting.

As described above, according to the present embodiment, by suppressing a higher order vibration mode that is excited by a harmonic component other than a driving frequency, included in the driving signal of the piezoelectric transformer, without using an inductive element, a driving efficiency and the reliability in terms of withstand power and distortion of the piezoelectric transformer can be enhanced.

Furthermore, according to the present embodiment, as shown in FIG. 8, positive and negative potentials +V and −V can be applied with respect to a zero potential (0) that is a ground level of the driving circuit, as a voltage to be applied to the piezoelectric transformer 1. Therefore, compared with Embodiments 1 and 2, waste power consumption can be suppressed since a voltage is not applied to the piezoelectric transformer 1 before operation. Furthermore, the potential of the driving signal is changed only from 0 (ground level) to +V, or only from 0 to −V, so that a switching noise can be decreased compared with Embodiments 1 and 2 in which the driving signal is changed from 0 to 2V.

Thus, according to the present embodiment, in addition to the advantages in Embodiments 1 and 2, a driving circuit for a piezoelectric transformer with the generation of noise further suppressed can be realized.

Embodiment 4

Figure 9:
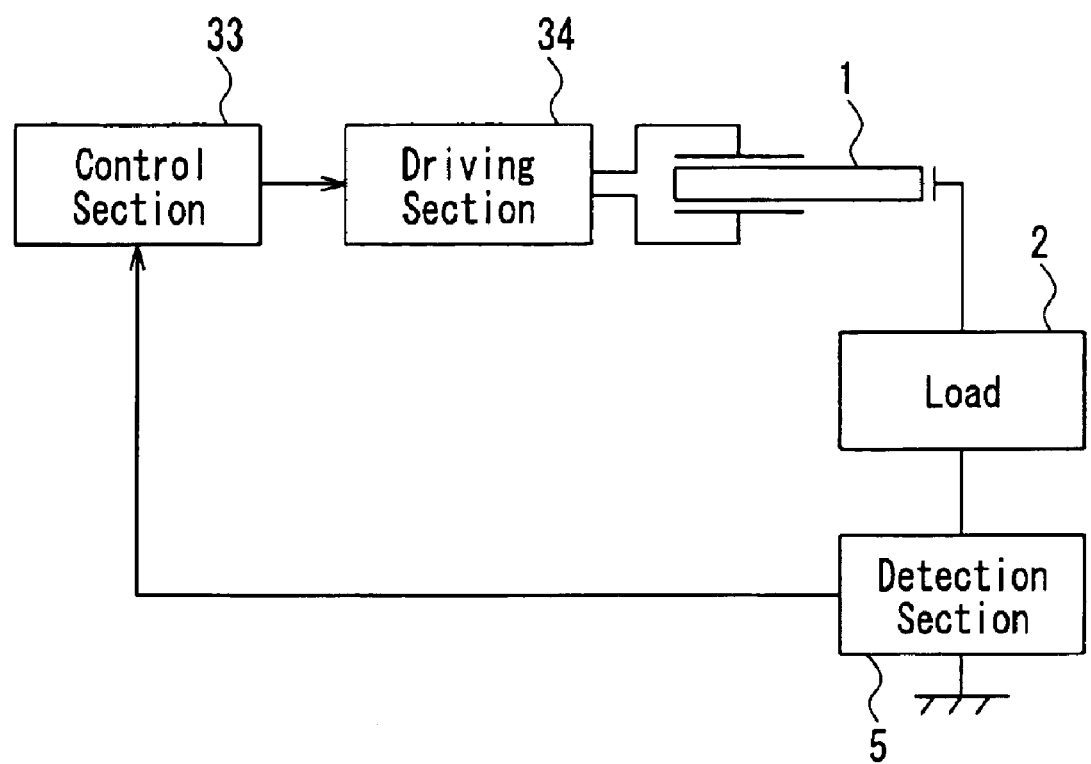
FIG. 9 is a block diagram showing an exemplary configuration of a piezoelectric transformer driving circuit according to Embodiment 4 of the present invention.

FIG. 9 is a block diagram showing an exemplary configuration of a driving circuit for a piezoelectric transformer according to Embodiment 4 of the present invention. In FIG. 9, the components having the same configurations and functions as those in Embodiment 1 are denoted with the same reference numerals as those therein, and the description thereof will be omitted here.

In the present embodiment, a voltage waveform of a driving signal applied to a primary side electrode from the driving section 34 to the piezoelectric transformer 1 based on the control signal from the control section 33 is different from that in Embodiment 1

Figure 10A:
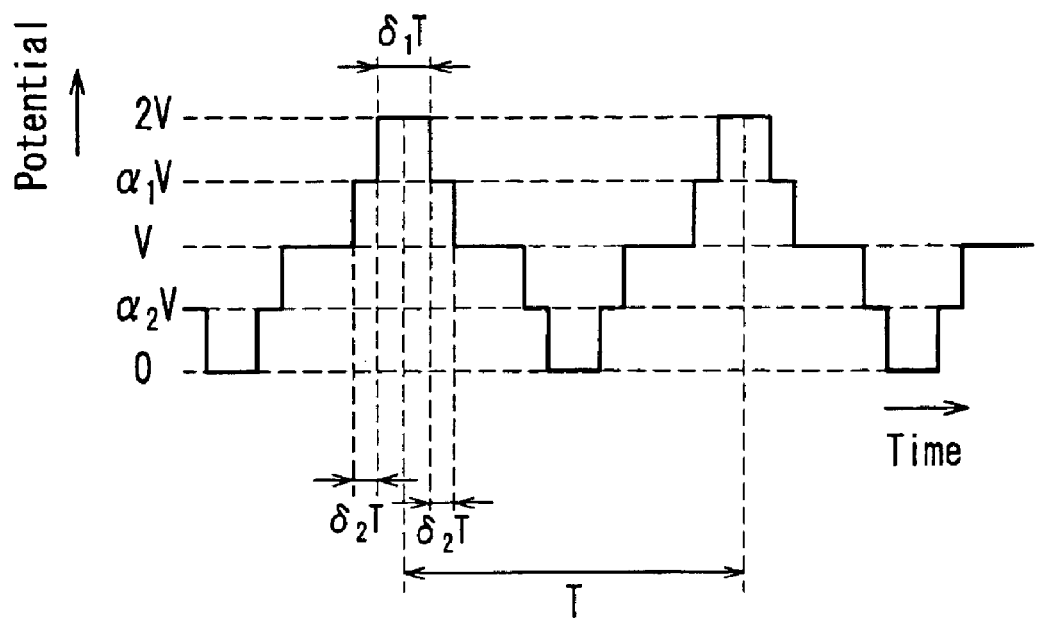
FIG. 10A is a waveform diagram showing an example of a driving signal in a rectangular waveform applied from a driving section 34 to a piezoelectric transformer 1 shown in FIG. 9.

FIG. 10A shows a waveform diagram showing an example of a driving signal in a rectangular waveform applied from the driving section 34 to the piezoelectric transformer 1. In FIG. 10A, a period T of the driving signal in a rectangular waveform corresponds to a reciprocal of the driving frequency of the piezoelectric transformer 1. Assuming that a first time ratio is $\delta_1$, and a second time ratio is $\delta_2$, a time period in which the potential of the driving signal becomes a maximum potential 2V or a minimum potential 0 is $\delta_1 T$, and a time period in which the potential of the driving signal becomes $\alpha_1 V$ or $\alpha_2 V$ is $\delta_2 T$. Herein, $\alpha_1$ is a coefficient satisfying the relationship: $1 < \alpha_2 < 2$, and $\alpha_2$ is a coefficient satisfying the relationship: $0 < \alpha_2 < 1$.

Figure 10B:
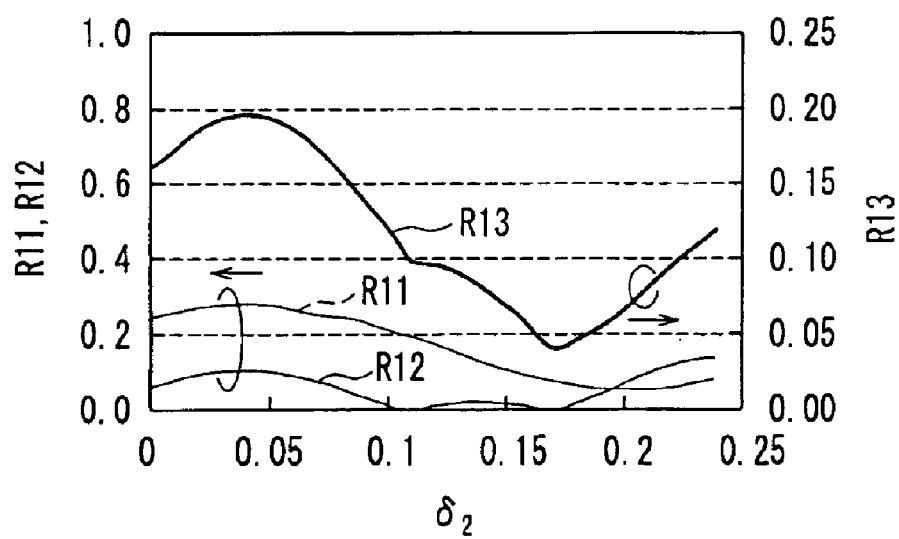
FIG. 10B is a graph showing changes in a ratio R11 of an amplitude of a third order vibration mode to an amplitude of a first order vibration mode, a ratio R12 of an amplitude of a fifth order vibration mode to the amplitude of the first order vibration mode, and a value R13 obtained by normalizing a sum of R11 and R12, with respect to a change in a second time ratio $\delta_2$, in a case where a first time ratio $\delta_1$ shown in FIG. 10A is set to be 0.21.

FIG. 10B is a graph showing changes in a ratio R11 of an amplitude of a third order vibration mode to an amplitude of a first order vibration mode, a ratio R12 of an amplitude of a fifth order vibration mode to the amplitude of the first order vibration mode, and a value R13 obtained by normalizing a sum of R11 and R12, with respect to a change in a second time ratio $\delta_2$, in a case where a first time ratio $\delta_1$ shown in FIG. 10A is set to be 0.21.

As shown in FIG. 10B, R13 becomes minimum when the second time ratio $\delta_2$ is in the vicinity of 0.17, in the case where the first time ratio $\delta_1$ is set to be 0.21. Therefore, when the second time ratio $\delta_2$ is set to be in the vicinity of 0.17, frequency components in the third order vibration mode and fifth order vibration mode can be decreased, compared with the case where the duty ratio of the driving signal in a rectangular waveform applied to the piezoelectric transformer 1 is 0.5. Furthermore, the influence of a higher order vibration mode can be decreased, compared with Embodiment 1 or 2.

Next, the operation of the driving circuit for the piezoelectric transformer 1 will be described, based on the first time ratio $\delta_1$ and the second time ratio $\delta_2$ obtained as described above.

In FIG. 9, the driving frequency and applied voltage (potential V, coefficients $\alpha_1$, $\alpha_2$ in FIG. 10A) of the piezoelectric transformer 1 are set in the control section 33. A control signal is generated based on the first time ratio $\delta_1$ and the second time ratio $\delta_2$ obtained as shown in FIG. 10B. In accordance with the control signal, the control section 34 supplies power to primary side electrodes of the piezoelectric transformer 1 in a voltage waveform with an amplitude shape as shown in FIG. 10A. The power supplied from the driving section 34 is stepped-up by the piezoelectric transformer 1 to be output, whereby the load 2 is supplied with the power. The detection section 5 detects an output state of the load 2, and sends a detection signal in accordance with the output state to the control section 33. The control section 33 controls the driving frequency or the applied voltage so that the output state of the load 2 is constant or varied, based on the detection signal from the detection section 5.

In the case of using a cold-cathode tube as the load 2 in a circuit composed of elements having the above-mentioned functions, the cold-cathode tube has a high impedance of hundreds of MΩ or higher until it starts lighting up, and the impedance of the cold-cathode tube is rapidly decreased to hundreds of kΩ during lighting. Consequently, the frequency characteristics of the resonance frequency and the voltage step-up ratio of the piezoelectric transformer 1 are varied. Therefore, the control section 33 can control the lighting of the cold-cathode tube and the brightness during lighting by setting the driving frequency and the applied voltage in accordance with the lighting state of the cold-cathode tube, i.e., a change in impedance.

As described above, according to the present embodiment, by suppressing a higher order vibration mode that is excited by a harmonic component other than a driving frequency, included in the driving signal of the piezoelectric transformer, without using an inductive element, a driving efficiency and the reliability in terms of withstand power and distortion of the piezoelectric transformer can be enhanced.

Furthermore, it is not necessarily required that the driving circuit of the present embodiment is realized with the components shown in FIG. 9, and other components may be used as long as they achieve the same functions as those in FIG. 9.

In the present embodiment, regarding the values of the first time ratio $\delta_1$ and the second time ratio $\delta_2$, the case has been described in which the piezoelectric transformer is excited in a first order vibration mode, considering the influence of a third order vibration mode and a fifth order vibration mode with respect to the first order vibration mode. According to the present invention, the influence of higher order modes is not limited to the consideration up to the fifth order vibration mode.

In addition, the vibration mode for exciting the piezoelectric transformer is not limited to a first order vibration mode. If the values of the first time ratio $\delta_1$ and the second time ratio $\delta_2$ are set, considering the influence of a vibration mode higher than the vibration mode that excites the piezoelectric transformer, the same effects can be obtained.

Furthermore, the driving frequency and driving voltage of the piezoelectric transformer 1 may be set in the control section 33 based on the detection signal from the detection section 5 in FIG. 9, by software processing using a microcomputer, peripheral equipment such as a data accumulation apparatus (e.g., a memory), or the like. Furthermore, the driving section 34 may be composed of a D/A converter or the like for outputting the driving voltage waveform as shown in FIG. 10A, an amplifier such as an operational amplifier, and the like.

Furthermore, in the present embodiment, the time ratio $\delta_1$ at which the level of the driving signal is a maximum potential or a minimum potential and the time ratio $\delta_2$ at which the level of the driving signal is a potential between the maximum potential and the minimum potential, with respect to the period T of the driving signal, are determined. More specifically, n is set to be 2, and the time ratios $\delta_1$ and $\delta_2$ until the n-th (=2) time at which the level of the driving signal is varied successively from the maximum potential and the minimum potential to the intermediate potential with respect to the period T of the driving signal are determined. However, the following may be possible: n is set to be 3 or more, and the time ratios $\delta_1, \delta_2, \ldots, \delta_n$ until the n-th time at which the level of the driving signal is varied successively from the maximum potential and the minimum potential to the intermediate potential with respect to the period T of the driving signal are determined.

Embodiment 5

Embodiment 5 of the present invention uses the driving circuit for the piezoelectric transformer shown in FIG. 1 referred to in the description of Embodiment 1. The present embodiment is different from Embodiment 1 as follows. In Embodiment 1, the time ratio $\delta$ is determined so as to minimize the value R3 obtained by normalizing the sum of the ratio R1 of the amplitude A3 of the third order vibration mode which is a higher order vibration mode and the ratio R2 of the amplitude A5 of the fifth order vibration mode which is a higher order vibration mode, with respect to the amplitude A1 of the first order vibration mode. In the present embodiment, the piezoelectric transformer is driven in a second order vibration mode, and the time ratio $\delta$ is determined so as to minimize the value R3 obtained by normalizing the sum of the ratio (R1) of the third order component (A3) of an input current which is a value of a high-order input current and the ratio (R2) of the fifth order component (A5) which is a value of a high-order input current, with respect to the first order component (A1) of the input current of the piezoelectric transformer.

Figure 11:
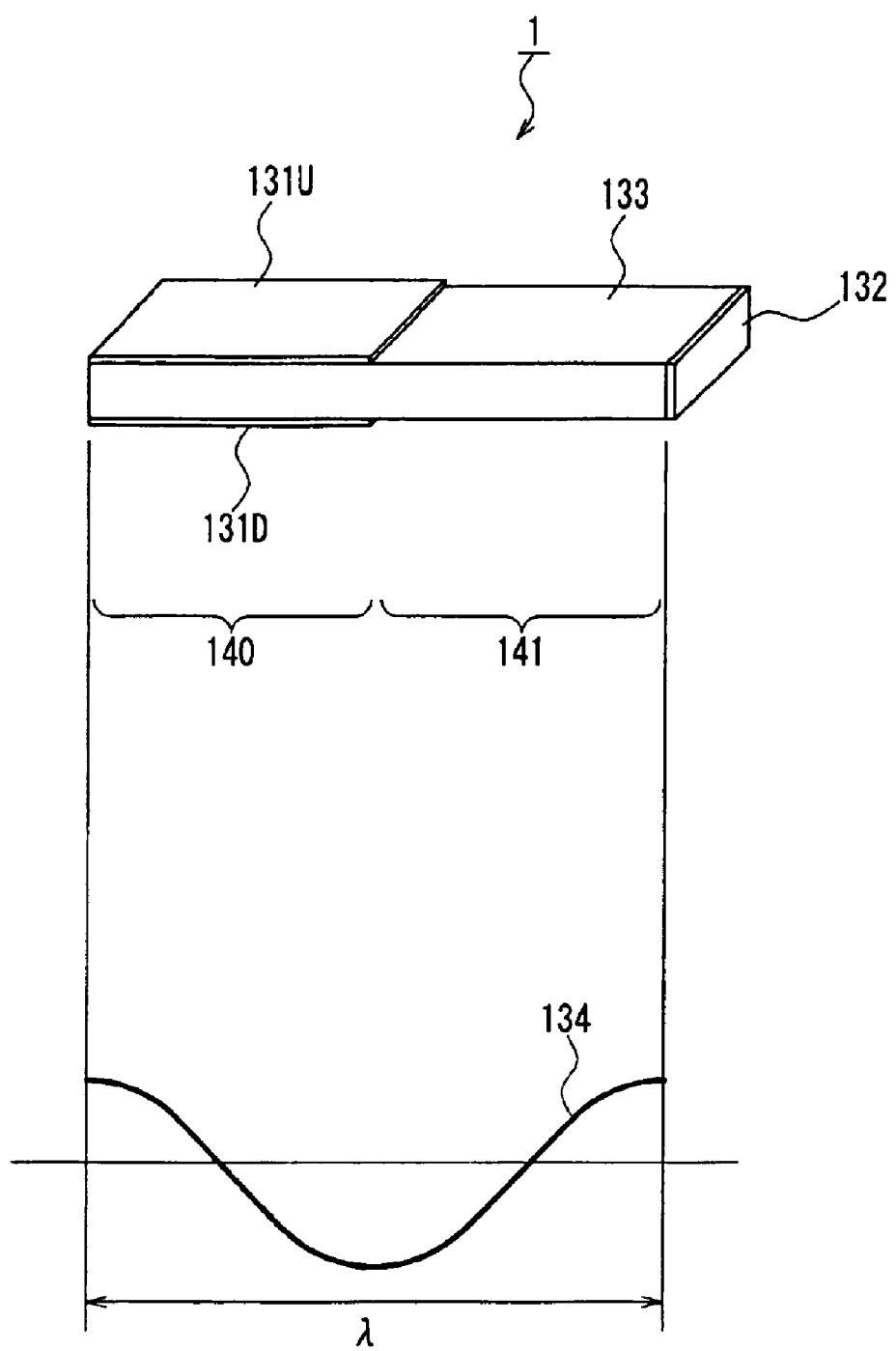
FIG. 11 shows a perspective view illustrating a configuration of the piezoelectric transformer 1 shown in FIG. 1 and a waveform diagram showing a displacement distribution of a λ (one wavelength) vibration mode, for illustrating Embodiment 5 of the present invention.

FIG. 11 shows a perspective view illustrating the configuration of the piezoelectric transformer 1 in FIG. 1, and a waveform diagram showing a displacement distribution of a λ (one wavelength) vibration mode. In FIG. 11, reference numeral 131U denotes a primary side upper electrode, 131d denotes a primary side lower electrode, 132 denotes a secondary side electrode, 133 denotes a piezoelectric body, 140 denotes a low impedance portion, and 141 denotes a high impedance portion. Furthermore, reference numeral 134 denotes a displacement distribution of a λ (one wavelength) vibration mode of the piezoelectric transformer 1.

Next, the operation of the piezoelectric transformer shown in FIG. 11 will be described. When an electric signal (driving signal) is applied to primary side electrodes 131U and 131D of the low impedance portion 140, an extension vibration in a longitudinal direction of the piezoelectric transformer 1 is excited by the inverse piezoelectric effect. The excited vibration is converted again to an electric signal by the piezoelectric effect in the high impedance portion 141, and the electric signal is output from the secondary side electrode 132.

Figure 12:
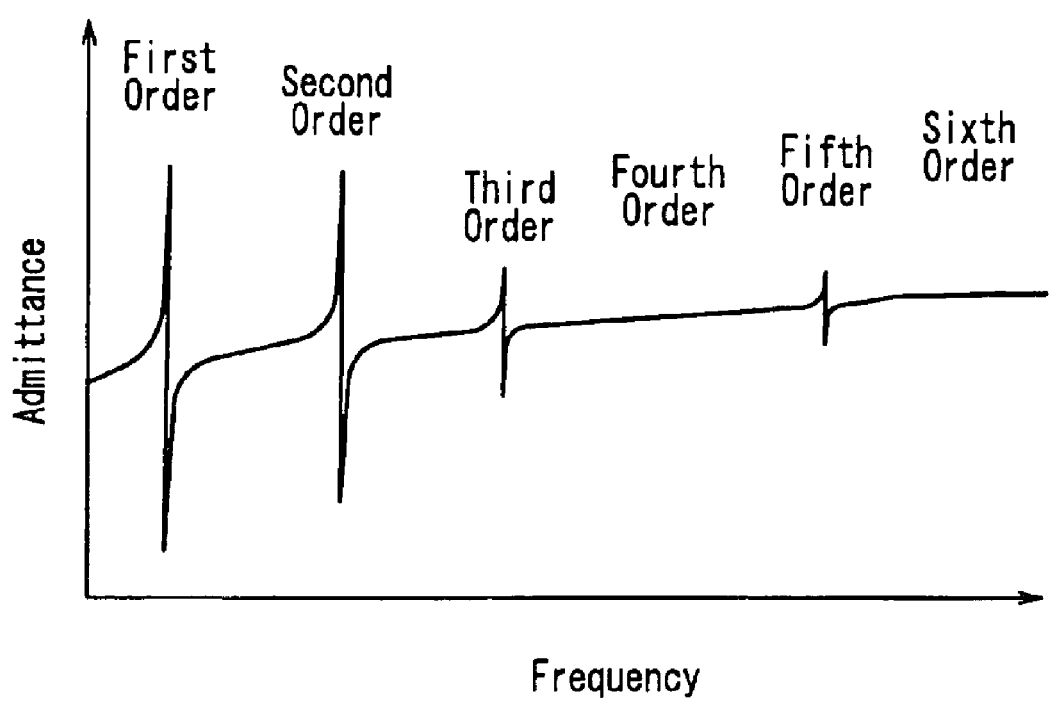
FIG. 12 is a graph showing frequency characteristics of admittance of a piezoelectric transformer 1 shown in FIG. 11, for illustrating Embodiment 5 of the present invention.

FIG. 12 is a graph showing frequency characteristics of admittance of the piezoelectric transformer 1 shown in FIG. 11. In FIG. 12, there are a plurality of vibration modes of the piezoelectric transformer 1. Furthermore, a fourth order or sixth order vibration mode is not excited (more specifically, a vibration mode of an even-number order of fourth order or more is not excited). In this case, the input electric signal is stored in the piezoelectric transformer 1, and returned to a power supply as reactive power.

Figure 13A:
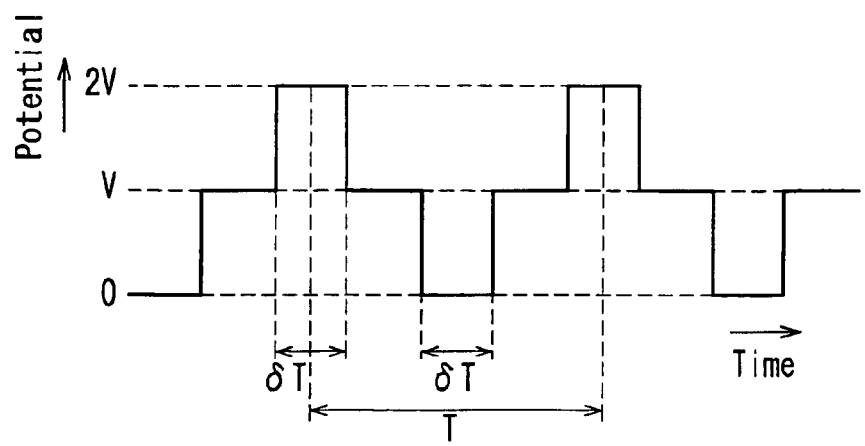
FIG. 13A is a waveform diagram showing an example of a driving signal in a rectangular waveform applied from the driving section 4 shown in FIG. 1 to the piezoelectric transformer 1, in Embodiment 5 of the present invention.

Therefore, in the case of driving the piezoelectric transformer 1 with a driving wavelength shown in FIG. 13A, using a second order vibration mode, a sixth order component (A3 in FIG. 13B) and a tenth order component (A5 in FIG. 13B), which are harmonic components, are input as reactive power due to capacitance components of the piezoelectric transformer 1.

FIG. 13A is a waveform diagram showing an example of a driving signal in a rectangular waveform applied from the driving section 4 to the piezoelectric transformer 1 in FIG. 1. In FIG. 13A, a period T of the driving signal in a rectangular waveform corresponds to a reciprocal of a driving frequency of the piezoelectric transformer 1, and a time period in which the potential of the driving signal is a maximum potential (2V) or a minimum potential (0) is set to be δT. V denotes an intermediate potential. More specifically, δ represents a time ratio at which the level of the driving signal is a maximum potential or a minimum potential, with respect to the period T of the driving signal.

Figure 13B:
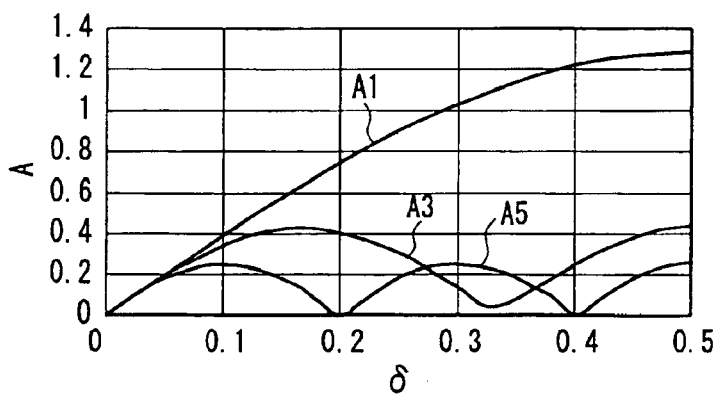
FIG. 13B is a graph showing a change in a component A of each input current calculated from a frequency component by Fourier transformation, with respect to a change in a time ratio δ shown in FIG. 13A.

FIG. 13B is a graph showing a change in each input current value A calculated from a frequency component by Fourier Transformation, with respect to a change in the time ratio δ shown in FIG. 13A. In FIG. 13B, A1 represents a change in the input current value A with respect to a change in the time ratio δ, of a first order component of the input current of the piezoelectric transformer; A3 represents a change in the input current value A with respect to a change in the time ratio δ, of a third order component of the input current of the piezoelectric transformer; and A5 represents a change in the input current value A with respect to a change in the time ratio δ, of a fifth order component of the input current of the piezoelectric transformer.

Figure 13C:
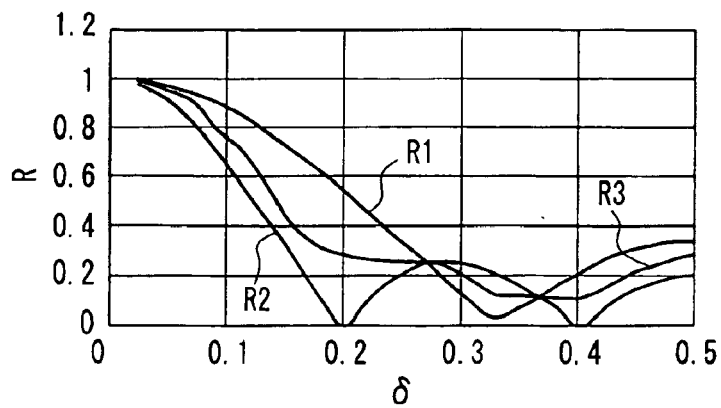
FIG. 13C is a graph showing a ratio R1 of a third order component A3 of an input current and a ratio R2 of a fifth order component A5 of an input current with respect to a first component Al of the input current shown in FIG. 13B, and a value R3 obtained by normalizing a sum of R1 and R2.

FIG. 13C is a graph showing a ratio R1 of the third order component value A3 of an input current that is higher than the first order component value A1, a ratio R2 of the fifth order component value A5 of an input current that is higher than the first order component value A1, with respect to the first order component value A1 of the input current shown in FIG. 13B, and a value R3 obtained by normalizing a sum of R1 and R2.

As shown in FIG. 13C, R3 becomes minimum when the time ratio δ is in the vicinity of 0.4 (40%). Therefore, when the time ratio δ is set to be in the vicinity of 0.4, higher order input current components can be decreased, compared with the case where δ is 0.5 (the duty ratio of the driving signal in a rectangular waveform applied to the piezoelectric transformer 1 is 0.5). As a result, the dielectric loss of the piezoelectric transformer can be decreased, and an operation with a high efficiency can be performed. Furthermore, heat generation can be decreased, so that the reliability of the piezoelectric transformer also can be enhanced.

Next, the operation of the driving circuit for the piezoelectric transformer 1 will be described with reference to FIG. 1, based on the time ratio δ obtained as described above.

In FIG. 1, the driving frequency and applied voltage (potential V in FIG. 13A) of the piezoelectric transformer 1 are set in the control section 3. A control signal is generated based on the time ratio δ obtained as shown in FIG. 13C. In accordance with the control signal, the driving section 4 supplies power to a primary side electrode of the piezoelectric transformer 1 in a voltage waveform with an amplitude shape as shown in FIG. 13A. The power supplied from the driving section 4 is stepped-up by the piezoelectric transformer 1 to be output, whereby the load 2 is supplied with the power. The detection section 5 detects an output state of the load 2, and sends a detection signal in accordance with the output state to the control section 3. The control section 3 controls the driving frequency or the applied voltage so that the output state of the load 2 is constant or varied, based on the detection signal from the detection section 5.

In the case of using a cold-cathode tube as the load 2 in a circuit composed of elements having the above-mentioned functions, the cold-cathode tube has a high impedance of hundreds of MΩ or higher until it starts lighting up, and the impedance of the cold-cathode tube is rapidly decreased to hundreds of kΩ during lighting. Consequently, the frequency characteristics of the resonance frequency and the voltage step-up ratio of the piezoelectric transformer 1 are varied. Therefore, the control section 3 can control the lighting of the cold-cathode tube and the brightness during lighting by setting the driving frequency and the applied voltage in accordance with the lighting state of the cold-cathode tube, i.e., a change in impedance.

As described above, according to the present embodiment, by suppressing an input current value of a harmonic component other than a driving frequency, included in the driving signal of the piezoelectric transformer, without using an inductive element, the driving efficiency of the piezoelectric transformer can be enhanced, and electromagnetic noise can be suppressed.

Furthermore, it is not necessarily required that the driving circuit of the present embodiment is realized with the components shown in FIG. 1, and other components may be used as long as they achieve the same functions as those in FIG. 1.

In addition, the vibration mode for exciting the piezoelectric transformer is not limited to a second order vibration mode. If the value of the time ratio δ is set considering a vibration mode higher than the vibration mode that excites the piezoelectric transformer and reactive power due to an input capacitance component, the same effects can be obtained.

In addition, the case has been described in which a vibration mode higher than the vibration mode exciting the piezoelectric transformer is not excited. However, even in the case where the vibration of some of harmonic components in an input voltage waveform is excited, and the vibration of some of harmonic components in an input voltage waveform is not excited, if the value of the time ratio δ is set so as to minimize a harmonic component of an input current (including a reactive current) to the piezoelectric transformer, the same effects can be obtained.

Furthermore, the driving frequency and driving voltage of the piezoelectric transformer 1 may be set in the control section 3 based on the detection signal from the detection section 5 in FIG. 1, by software processing using a microcomputer, peripheral equipment such as a data accumulation apparatus (e.g., a memory), or the like. Furthermore, the driving section 4 may be composed of a D/A converter or the like for outputting the driving voltage waveform as shown in FIG. 13A, an amplifier such as an operational amplifier, and the like.

Furthermore, in the present embodiment, the time ratio δ at which the level of the driving signal is a maximum potential or a minimum potential, with respect to the period T of the driving signal, is determined. However, the same effect can be obtained even in the following configuration as in Embodiment 4. The time ratio $\delta_1$ at which the level of the driving signal is a maximum potential or a minimum potential and the time ratio $\delta_2$ at which the level of the driving signal is a potential between the maximum potential and the minimum potential, with respect to the period T of the driving signal, are determined. More specifically, n is set to be 2, and the time ratios $\delta_1$ and $\delta_2$ until the n-th (=2) time at which the level of the driving signal is varied successively from the maximum potential and the minimum potential to the intermediate potential, with respect to the period T of the driving signal, are determined.

Furthermore, the following may be possible: n is set to be 3 or more, and the time ratios $\delta_1, \delta_2, \ldots, \delta_n$ until the n-th time at which the level of the driving signal is varied successively from the maximum potential and the minimum potential to the intermediate potential, with respect to the period T of the driving signal, are determined.

Embodiment 6

Figure 14:
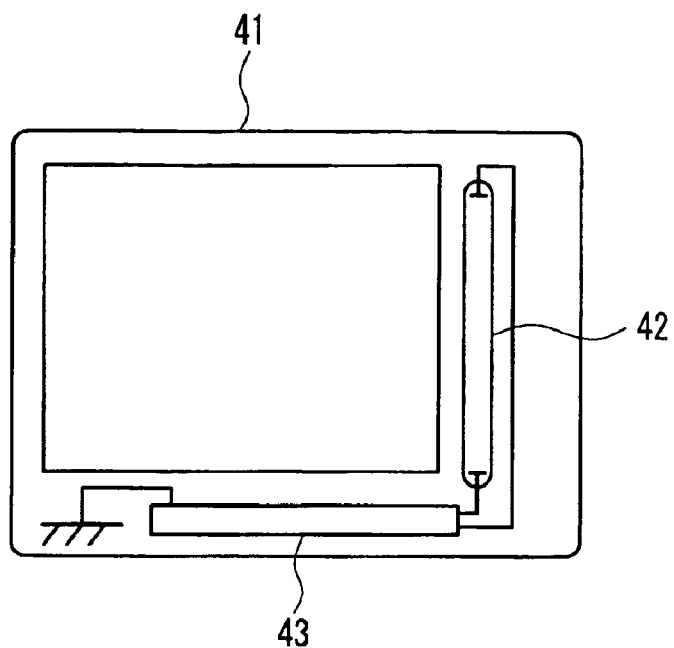
FIG. 14 is a schematic diagram showing an internal configuration of a liquid crystal panel according to Embodiment 6 of the present invention.

FIG. 14 is a schematic diagram showing an internal configuration of a liquid crystal panel according to Embodiment 6 of the present invention. A liquid crystal panel 41 of the present embodiment is mounted on a liquid crystal display, a liquid crystal monitor, or the like, and uses a driving circuit for the piezoelectric transformer of any of Embodiments 1 to 5 as an inverter circuit 43 for driving a cold-cathode tube 42 that is a backlight of the liquid crystal panel 41. The cold-cathode tube 42 and the inverter circuit 43 constitute a cold-cathode tube light-emitting apparatus.

In a conventional transformer of an electromagnetic type, a high voltage at the commencement of lighting of a cold-cathode tube should be output at all times. However, according to the present embodiment, a piezoelectric transformer is used, and an output voltage thereof is varied in accordance with a load fluctuation at the commencement of lighting and during lighting of a cold-cathode tube. Therefore, an adverse effect on another circuit system mounted on a liquid crystal panel can be eliminated.

Furthermore, a piezoelectric transformer can handle more electric energy per unit volume larger than an electromagnetic transformer, so that the volume of the piezoelectric transformer can be reduced. Furthermore, the piezoelectric transformer uses a longitudinal vibration of a rectangular plate, so that it is advantageous for being made thin because of its shape. Consequently, the piezoelectric transformer can be mounted even in a narrow place such as an edge portion of a liquid crystal panel, which results in miniaturization and light-weight of a liquid crystal panel.

Embodiment 7

Figure 15:
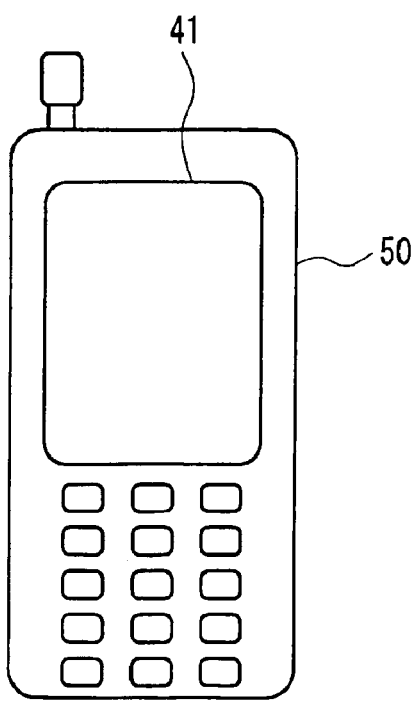
FIG. 15 is a schematic diagram showing an external configuration of a mobile telephone as a device with a built-in liquid crystal panel according to Embodiment 7 of the present invention.
Figure 16A:
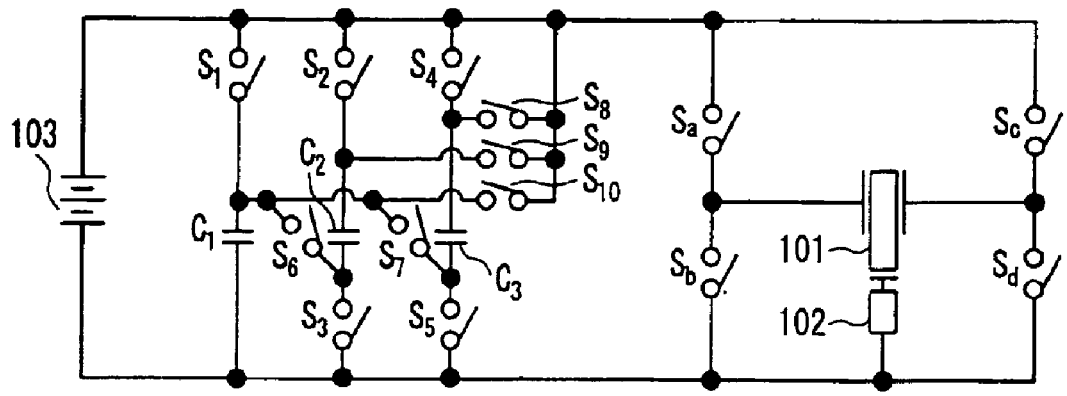
FIG. 16A is a circuit diagram showing an exemplary configuration of a driving circuit for a piezoelectric transformer according Conventional Example 1.
Figure 16B:
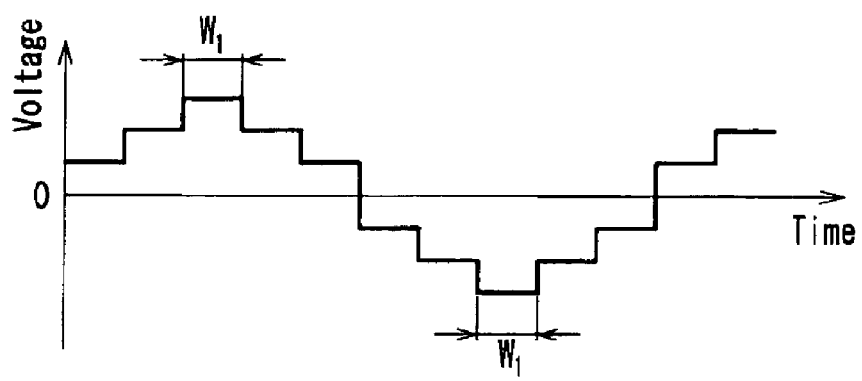
FIG. 16B is a waveform diagram showing a voltage applied to a piezoelectric transformer 101 shown in FIG. 16A.
Figure 17:
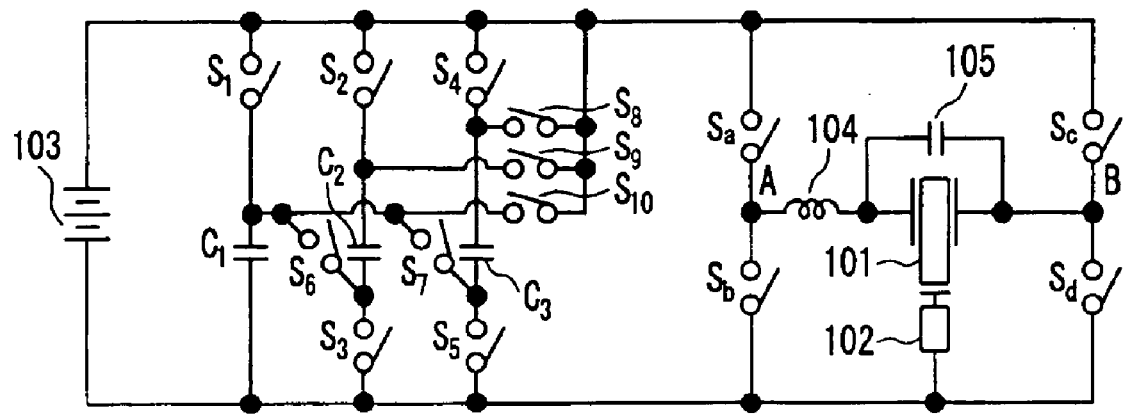
FIG. 17 is a circuit diagram showing an exemplary configuration of a driving circuit for a piezoelectric transformer according to Conventional Example 2.

FIG. 15 is a schematic view showing an external configuration of a mobile telephone as a device with a built-in liquid crystal panel according to Embodiment 7 of the present invention. The liquid crystal panel 41 in Embodiment 6 is mounted on a mobile telephone 50 of the present embodiment.

According to the present embodiment, the liquid crystal panel 41 including a driving circuit for a piezoelectric transformer of any of Embodiments 1 to 5 is mounted on, for example, a mobile telephone 50. Thus, the device can be miniaturized, and the reliability thereof can be enhanced.

In the present embodiment, the case in which a liquid crystal panel is mounted on a mobile telephone has been described. However, even if a liquid crystal panel is mounted on a mobile information terminal, a communication terminal, etc., the same advantage is obtained.

As described above, according to the present invention, by suppressing an input current value of a harmonic component other than a driving frequency, included in the driving signal of the piezoelectric transformer, without using an inductive element, the driving efficiency of the piezoelectric transformer can be enhanced and electromagnetic noise can be suppressed. Furthermore, by suppressing a higher order vibration mode that is excited by a harmonic component other than a driving frequency, the reliability in terms of withstand power and distortion of the piezoelectric transformer can be enhanced.

Furthermore, by including a cold-cathode tube light-emitting apparatus that controls the light emission of a cold-cathode tube by the driving circuit of the present invention in a liquid crystal panel, and by incorporating the liquid crystal panel into equipment such as a mobile telephone, an information mobile terminal, and a communication terminal, the device can be miniaturized, and the reliability thereof can be enhanced.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for driving a piezoelectric transformer in which a primary side electrode and a secondary side electrode are formed in a piezoelectric body, and a driving signal input from the primary side electrode is converted and output from the secondary side electrode to a load, comprising the steps of:

detecting an output state to the load to generate a detection signal; and generating the driving signal for controlling a driving frequency and input power of the piezoelectric transformer based on the detection signal, wherein the driving signal is a signal in a rectangular waveform having time periods up to an n-th (n is a natural number of 1 or more) time period in which a level is varied successively from a maximum potential and a minimum potential to an intermediate potential, obtained by respectively multiplying a period of the driving signal by time ratios up to an n-th time ratio, a sum of the time ratios up to the n-th time ratio is set to be smaller than 0.5, and the time ratios up to the n-th time ratio are set so as to minimize a sum of ratios of values of respective higher order input currents with respect to a value of an input current with a frequency that excites the piezoelectric transformer.

2. The method for driving a piezoelectric transformer according to claim 1, wherein the load is a cold-cathode tube.

3. A method for driving a piezoelectric transformer in which a primary side electrode and a secondary side electrode are formed in a piezoelectric body, and a driving signal input from the primary side electrode is converted and output from the secondary side electrode to a load, comprising the steps of:

detecting an output state to the load to generate a detection signal; and generating the driving signal for controlling a driving frequency and input power of the piezoelectric transformer based on the detection signal, wherein the driving signal is a signal in a rectangular waveform having a time period in which a level is a maximum potential or a minimum potential, obtained by multiplying a period of the driving signal by a predetermined time ratio, and the time ratio is set to be smaller than 0.5 and so as to minimize a sum of ratios of values of respective higher order input currents with respect to a value of an input current with a frequency that excites the piezoelectric transformer.

4. The method for driving a piezoelectric transformer according to claim 3, wherein the load is a cold-cathode tube.

5. A method for driving a piezoelectric transformer in which a primary side electrode and a secondary side electrode are formed in a piezoelectric body, and a driving signal input from the primary side electrode is converted and output from the secondary side electrode to a load, comprising the steps of:

detecting an output state to the load to generate a detection signal; and generating the driving signal for controlling a driving frequency and input power of the piezoelectric transformer based on the detection signal, wherein the driving signal is a signal in a rectangular waveform having a first time period in which a level is a maximum potential or a minimum potential, obtained by multiplying a period of the driving signal by a first time ratio and a second time period in which a level is a potential between the maximum potential and the minimum potential, obtained by multiplying a period of the driving signal by a second time ratio, a sum of the first time ratio and the second time ratio is set to be smaller than 0.5, and the first time ratio and the second time ratio are set so as to minimize a sum of ratios of values of respective higher order input currents with respect to a value of an input current with a frequency that excites the piezoelectric transformer.

6. The method for driving a piezoelectric transformer according to claim 5, wherein the load is a cold-cathode tube.

7. A method for driving a piezoelectric transformer in which a primary side electrode and a secondary side electrode are formed in a piezoelectric body, and a driving signal input from the primary side electrode is converted and output from the secondary side electrode to a load, comprising the steps of:
  detecting an output state to the load to generate a detection signal; and
  generating the driving signal for controlling a driving frequency and input power of the piezoelectric transformer based on the detection signal,
  wherein the driving signal is a signal in a rectangular waveform having time periods up to an n-th (n is a natural number of 1 or more) time period in which a level is varied successively from a maximum potential and a minimum potential to an intermediate potential, obtained by respectively multiplying a period of the driving signal by time ratios up to an n-th time ratio, a sum of the time ratios up to the n-th time ratio is set to be smaller than 0.5, and the time ratios up to the n-th time ratio are set so as to minimize a sum of ratios of amplitudes of respective higher order vibration modes with respect to an amplitude of a vibration mode that excites the piezoelectric transformer.

8. The method for driving a piezoelectric transformer according to claim 7, wherein the load is a cold-cathode tube.

9. A method for driving a piezoelectric transformer in which a primary side electrode and a secondary side electrode are formed in a piezoelectric body, and a driving signal input from the primary side electrode is converted and output from the secondary side electrode to a load, comprising the steps of:
  detecting an output state to the load to generate a detection signal; and
  generating the driving signal for controlling a driving frequency and input power of the piezoelectric transformer based on the detection signal,
  wherein the driving signal is a signal in a rectangular waveform having a time period in which a level is a maximum potential or a minimum potential, obtained by multiplying a period of the driving signal by a predetermined time ratio, and the time ratio is set to be smaller than 0.5 and so as to minimize a sum of ratios of amplitudes of respective higher order vibration modes with respect to an amplitude of a vibration mode that excites the piezoelectric transformer.

10. The method for driving a piezoelectric transformer according to claim 9, wherein the load is a cold-cathode tube.

11. A method for driving a piezoelectric transformer in which a primary side electrode and a secondary side electrode are formed in a piezoelectric body, and a driving signal input from the primary side electrode is converted and output from the secondary side electrode to a load, comprising the steps of:
  detecting an output state to the load to generate a detection signal; and
  generating the driving signal for controlling a driving frequency and input power of the piezoelectric transformer based on the detection signal,
  wherein the driving signal is a signal in a rectangular waveform having a first time period in which a level is a maximum potential or a minimum potential, obtained by multiplying a period of the driving signal by a first time ratio and a second time period in which a level is a potential between the maximum potential and the minimum potential, obtained by multiplying a period of the driving signal by a second time ratio, a sum of the first time ratio and the second time ratio is set to be smaller than 0.5, and the first time ratio and the second time ratio are set so as to minimize a sum of ratios of amplitudes of respective higher order vibration modes with respect to an amplitude of a vibration mode that excites the piezoelectric transformer.

12. The method for driving a piezoelectric transformer according to claim 11, wherein the load is a cold-cathode tube.

13. A driving circuit for a piezoelectric transformer, comprising:
  a piezoelectric transformer in which a primary side electrode and a secondary side electrode are formed in a piezoelectric body, and a driving signal input from the primary side electrode is converted and output from the secondary side electrode to a load;
  a detection section for detecting an output state to the load to generate a detection signal;
  a control section for generating a control signal for controlling a driving frequency and input power of the piezoelectric transformer based on the detection signal output from the detection section; and
  a driving section for supplying the driving signal to the piezoelectric transformer based on the control signal output from the control section,
  wherein the driving signal is a signal in a rectangular waveform having time periods up to an n-th (n is a natural number of 1 or more) time period in which a level is varied successively from a maximum potential and a minimum potential to an intermediate potential, obtained by respectively multiplying a period of the driving signal by time ratios up to an n-th time ratio, and
  the control section sets a sum of the time ratios up to the n-th time ratio to be smaller than 0.5, and sets the time ratios up to the n-th time ratio so as to minimize a sum of ratios of values of respective higher order input currents with respect to a value of an input current with a frequency that excites the piezoelectric transformer.

14. The driving circuit for a piezoelectric transformer according to claim 13, wherein the load is a cold-cathode tube.

15. A driving circuit for a piezoelectric transformer, comprising:
  a piezoelectric transformer in which a primary side electrode and a secondary side electrode are formed in a piezoelectric body, and a driving signal input from the primary side electrode is converted and output from the secondary side electrode to a load;

a detection section for detecting an output state to the load to generate a detection signal;

a control section for generating a control signal for controlling a driving frequency and input power of the piezoelectric transformer based on the detection signal output from the detection section; and a driving section for supplying the driving signal to the piezoelectric transformer based on the control signal output from the control section, wherein the driving signal is a signal in a rectangular waveform having a time period in which a level is a maximum potential or a minimum potential, obtained by multiplying a period of the driving signal by a predetermined time ratio, and the driving section includes at least two switching elements, and the control section controls a duty ratio or a phase of at least two control signals to be supplied to the switching elements, thereby setting the time ratio to be smaller than 0.5 and so as to minimize a sum of ratios of values of respective higher order input currents with respect to a value of an input current with a frequency that excites the piezoelectric transformer.

16. The driving circuit for a piezoelectric transformer according to claim 15, wherein the load is a cold-cathode tube.

17. A driving circuit for a piezoelectric transformer, comprising:

a piezoelectric transformer in which a primary side electrode and a secondary side electrode are formed in a piezoelectric body, and a driving signal input from the primary side electrode is converted and output from the secondary side electrode to a load;

a detection section for detecting an output state to the load to generate a detection signal;

a control section for generating a control signal for controlling a driving frequency and input power of the piezoelectric transformer based on the detection signal output from the detection section; and a driving section for supplying the driving signal to the piezoelectric transformer based on the control signal output from the control section, wherein the driving signal is a signal in a rectangular waveform having a first time period in which a level is a maximum potential or a minimum potential, obtained by multiplying a period of the driving signal by a first time ratio and a second time period in which a level is a potential between the maximum potential and the minimum potential, obtained by multiplying a period of the driving signal by a second time ratio, and the control section sets a sum of the first time ratio and the second time ratio to be smaller than 0.5, and sets the first time ratio and the second time ratio so as to minimize a sum of ratios of values of respective higher order input currents with respect to a value of an input current with a frequency that excites the piezoelectric transformer.

18. The driving circuit for a piezoelectric transformer according to claim 17, wherein the load is a cold-cathode tube.

19. A driving circuit for a piezoelectric transformer, comprising:

a piezoelectric transformer in which a primary side electrode and a secondary side electrode are formed in a piezoelectric body, and a driving signal input from the primary side electrode is converted and output from the secondary side electrode to a load;

a detection section for detecting an output state to the load to generate a detection signal;

a control section for generating a control signal for controlling a driving frequency and input power of the piezoelectric transformer based on the detection signal output from the detection section; and a driving section for supplying the driving signal to the piezoelectric transformer based on the control signal output from the control section, wherein the driving signal is a signal in a rectangular waveform having time periods up to an n-th (n is a natural number of 1 or more) time period in which a level is varied successively from a maximum potential and a minimum potential to an intermediate potential, obtained by respectively multiplying a period of the driving signal by time ratios up to an n-th time ratio, and the control section sets a sum of the time ratios up to the n-th time ratio to be smaller than 0.5, and sets the time ratios up to the n-th time ratio so as to minimize a sum of ratios of amplitudes of respective higher order vibration modes with respect to an amplitude of a vibration mode that excites the piezoelectric transformer.

20. The driving circuit for a piezoelectric transformer according to claim 19, wherein the load is a cold-cathode tube.

21. A driving circuit for a piezoelectric transformer, comprising:

a piezoelectric transformer in which a primary side electrode and a secondary side electrode are formed in a piezoelectric body, and a driving signal input from the primary side electrode is converted and output from the secondary side electrode to a load;

a detection section for detecting an output state to the load to generate a detection signal;

a control section for generating a control signal for controlling a driving frequency and input power of the piezoelectric transformer based on the detection signal output from the detection section; and a driving section for supplying the driving signal to the piezoelectric transformer based on the control signal output from the control section, wherein the driving signal is a signal in a rectangular waveform having a time period in which a level is a maximum potential or a minimum potential, obtained by multiplying a period of the driving signal by a predetermined time ratio, and the driving section includes at least two switching elements, and the control section controls a duty ratio or a phase of at least two control signals to be supplied to the switching elements, thereby setting the time ratio to be smaller than 0.5 and so as to minimize a sum of ratios of amplitudes of respective higher order vibration modes with respect to an amplitude of a vibration mode that excites the piezoelectric transformer.

22. The driving circuit for a piezoelectric transformer according to claim 21, wherein the load is a cold-cathode tube.

23. A driving circuit for a piezoelectric transformer, comprising:

a piezoelectric transformer in which a primary side electrode and a secondary side electrode are formed in a piezoelectric body, and a driving signal input from the primary side electrode is converted and output from the secondary side electrode to a load;

a detection section for detecting an output state to the load to generate a detection signal;

a control section for generating a control signal for controlling a driving frequency and input power of the piezoelectric transformer based on the detection signal output from the detection section; and a driving section for supplying the driving signal to the piezoelectric transformer based on the control signal output from the control section, wherein the driving signal is a signal in a rectangular waveform having a first time period in which a level is a maximum potential or a minimum potential, obtained by multiplying a period of the driving signal by a first time ratio and a second time period in which a level is a potential between the maximum potential and the minimum potential, obtained by multiplying a period of the driving signal by a second time ratio, and the control section sets a sum of the first time ratio and the second time ratio to be smaller than 0.5, and sets the first time ratio and the second time ratio so as to minimize a sum of ratios of amplitudes of respective higher order vibration modes with respect to an amplitude of a vibration mode that excites the piezoelectric transformer.

24. The driving circuit for a piezoelectric transformer according to claim 23, wherein the load is a cold-cathode tube.

25. A cold-cathode tube light-emitting apparatus, comprising:

a piezoelectric transformer in which a primary side electrode and a secondary side electrode are formed in a piezoelectric body, and a driving signal input from the primary side electrode is converted and output from the secondary side electrode;

a cold-cathode tube connected to the secondary side electrode of the piezoelectric transformer;

a detection section for detecting an output state to the cold-cathode tube to generate a detection signal;

a control section for generating a control signal for controlling a driving frequency and input power of the piezoelectric transformer based on the detection signal output from the detection section; and a driving section for supplying the driving signal to the piezoelectric transformer based on the control signal output from the control section, wherein the driving signal is a signal in a rectangular waveform having time periods up to an n-th (n is a natural number of 1 or more) time period in which a level is varied successively from a maximum potential and a minimum potential to an intermediate potential, obtained by respectively multiplying a period of the driving signal by time ratios up to an n-th time ratio, and the control section sets a sum of the time ratios up to the n-th time ratio to be smaller than 0.5 and sets the time ratios up to the n-th time ratio so as to minimize a sum of ratios of values of respective higher order input currents with respect to a value of an input current with a frequency that excites the piezoelectric transformer, and generates the control signal based on the set time ratios up to the n-th time ratio.

26. A cold-cathode tube light-emitting apparatus, comprising:

a piezoelectric transformer in which a primary side electrode and a secondary side electrode are formed in a piezoelectric body, and a driving signal input from the primary side electrode is converted and output from the secondary side electrode;

a cold-cathode tube connected to the secondary side electrode of the piezoelectric transformer;

a detection section for detecting an output state to the cold-cathode tube to generate a detection signal;

a control section for generating a control signal for controlling a driving frequency and input power of the piezoelectric transformer based on the detection signal output from the detection section; and a driving section for supplying the driving signal to the piezoelectric transformer based on the control signal output from the control section, wherein the driving signal is a signal in a rectangular waveform having a time period in which a level is a maximum potential or a minimum potential, obtained by multiplying a period of the driving signal by a predetermined time ratio, and the control section sets the time ratio to be smaller than 0.5 and so as to minimize a sum of ratios of values of respective higher order input currents with respect to a value of an input current of a frequency that excites the piezoelectric transformer, and generates the control signal based on the set time ratio.

27. A cold-cathode tube light-emitting apparatus, comprising:

a piezoelectric transformer in which a primary side electrode and a secondary side electrode are formed in a piezoelectric body, and a driving signal input from the primary side electrode is converted and output from the secondary side electrode;

a cold-cathode tube connected to the secondary side electrode of the piezoelectric transformer;

a detection section for detecting an output state to the cold-cathode tube to generate a detection signal;

a control section for generating a control signal for controlling a driving frequency and input power of the piezoelectric transformer based on the detection signal output from the detection section; and a driving section for supplying the driving signal to the piezoelectric transformer based on the control signal output from the control section, wherein the driving signal is a signal in a rectangular waveform having a first time period in which a level is a maximum potential or a minimum potential, obtained by multiplying a period of the driving signal by a first time ratio and a second time period in which a level is a potential between the maximum potential and the minimum potential, obtained by multiplying a period of the driving signal by a second time ratio, and the control section sets a sum of the first time ratio and the second time ratio to be smaller than 0.5 and sets the first time ratio and the second time ratio so as to minimize a sum of ratios of values of respective higher order input currents with respect to a value of an input current with a frequency that excites the piezoelectric transformer, and generates the control signal based on the set first and second time ratios.

28. A cold-cathode tube light-emitting apparatus, comprising:

a piezoelectric transformer in which a primary side electrode and a secondary side electrode are formed in a piezoelectric body, and a driving signal input from the primary side electrode is converted and output from the secondary side electrode;

a cold-cathode tube connected to the secondary side electrode of the piezoelectric transformer;

a detection section for detecting an output state to the cold-cathode tube to generate a detection signal;

a control section for generating a control signal for controlling a driving frequency and input power of the piezoelectric transformer based on the detection signal output from the detection section; and a driving section for supplying the driving signal to the piezoelectric transformer based on the control signal output from the control section, wherein the driving signal is a signal in a rectangular waveform having time periods up to an n-th (n is a natural number of 1 or more) time period in which a level is varied successively from a maximum potential and a minimum potential to an intermediate potential, obtained by respectively multiplying a period of the driving signal by time ratios up to an n-th time ratio, and the control section sets a sum of the time ratios up to the n-th time ratio to be smaller than 0.5 and sets the time ratios up to the n-th time ratio so as to minimize a sum of ratios of amplitudes of respective higher order vibration modes with respect to an amplitude of a vibration mode that excites the piezoelectric transformer, and generates the control signal based on the set time ratios up to the n-th time ratio.

29. A cold-cathode tube light-emitting apparatus, comprising:

a piezoelectric transformer in which a primary side electrode and a secondary side electrode are formed in a piezoelectric body, and a driving signal input from the primary side electrode is converted and output from the secondary side electrode;

a cold-cathode tube connected to the secondary side electrode of the piezoelectric transformer;

a detection section for detecting an output state to the cold-cathode tube to generate a detection signal;

a control section for generating a control signal for controlling a driving frequency and input power of the piezoelectric transformer based on the detection signal output from the detection section; and a driving section for supplying the driving signal to the piezoelectric transformer based on the control signal output from the control section, wherein the driving signal is a signal in a rectangular waveform having a time period in which a level is a maximum potential or a minimum potential, obtained by multiplying a period of the driving signal by a predetermined time ratio, the control section sets the time ratio to be smaller than 0.5 and so as to minimize a sum of ratios of amplitudes of respective higher order vibration modes with respect to an amplitude of a vibration mode that excites the piezoelectric transformer, and generates the control signal based on the set time ratio.

30. A cold-cathode tube light-emitting apparatus, comprising:

a piezoelectric transformer in which a primary side electrode and a secondary side electrode are formed in a piezoelectric body, and a driving signal input from the primary side electrode is converted and output from the secondary side electrode;

a cold-cathode tube connected to the secondary side electrode of the piezoelectric transformer;

a detection section for detecting an output state to the cold-cathode tube to generate a detection signal;

a control section for generating a control signal for controlling a driving frequency and input power of the piezoelectric transformer based on the detection signal output from the detection section; and a driving section for supplying the driving signal to the piezoelectric transformer based on the control signal output from the control section, wherein the driving signal is a signal in a rectangular waveform having a first time period in which a level is a maximum potential or a minimum potential, obtained by multiplying a period of the driving signal by a first time ratio and a second time period in which a level is a potential between the maximum potential and the minimum potential, obtained by multiplying a period of the driving signal by a second time ratio, the control section sets a sum of the first time ratio and the second time ratio to be smaller than 0.5 and sets the first time ratio and the second time ratio so as to minimize a sum of ratios of amplitudes of respective higher order vibration modes with respect to an amplitude of a vibration mode that excites the piezoelectric transformer, and generates the control signal based on the set first and second time ratios.

31. A liquid crystal panel including a cold-cathode tube light-emitting apparatus and having a brightness controlled by the cold-cathode tube light-emitting apparatus, the cold-cathode tube light-emitting apparatus comprising:

a piezoelectric transformer in which a primary side electrode and a secondary side electrode are formed in a piezoelectric body, and a driving signal input from the primary side electrode is converted and output from the secondary side electrode;

a cold-cathode tube connected to the secondary side electrode of the piezoelectric transformer;

a detection section for detecting an output state to the cold-cathode tube to generate a detection signal;

a control section for generating a control signal for controlling a driving frequency and input power of the piezoelectric transformer based on the detection signal output from the detection section; and a driving section for supplying the driving signal to the piezoelectric transformer based on the control signal output from the control section, wherein the driving signal is a signal in a rectangular waveform having time periods up to an n-th (n is a natural number of 1 or more) time period in which a level is varied successively from a maximum potential and a minimum potential to an intermediate potential, obtained by respectively multiplying a period of the driving signal by time ratios up to an n-th time ratio, and the control section sets a sum of the time ratios up to the n-th time ratio to be smaller than 0.5 and sets the time ratios up to the n-th time ratio so as to minimize a sum of ratios of values of respective higher order input currents with respect to a value of an input current with a frequency that excites the piezoelectric transformer, and generates the control signal based on the set time ratios up to the n-th time ratio.

32. A liquid crystal panel including a cold-cathode tube light-emitting apparatus and having a brightness controlled by the cold-cathode tube light-emitting apparatus, the cold-cathode tube light-emitting apparatus comprising:

a piezoelectric transformer in which a primary side electrode and a secondary side electrode are formed in a piezoelectric body, and a driving signal input from the primary side electrode is converted and output from the secondary side electrode;

a cold-cathode tube connected to the secondary side electrode of the piezoelectric transformer;

a detection section for detecting an output state to the cold-cathode tube to generate a detection signal;

a control section for generating a control signal for controlling a driving frequency and input power of the piezoelectric transformer based on the detection signal output from the detection section; and a driving section for supplying the driving signal to the piezoelectric transformer based on the control signal output from the control section, wherein the driving signal is a signal in a rectangular waveform having a time period in which a level is a maximum potential or a minimum potential, obtained by multiplying a period of the driving signal by a predetermined time ratio, and the control section sets the time ratio to be smaller than 0.5 and so as to minimize a sum of ratios of values of respective higher order input currents with respect to a value of an input current of a frequency that excites the piezoelectric transformer, and generates the control signal based on the set time ratio.

33. A liquid crystal panel including a cold-cathode tube light-emitting apparatus and having a brightness controlled by the cold-cathode tube light-emitting apparatus, the cold-cathode tube light-emitting apparatus comprising:

a piezoelectric transformer in which a primary side electrode and a secondary side electrode are formed in a piezoelectric body, and a driving signal input from the primary side electrode is converted and output from the secondary side electrode;

a cold-cathode tube connected to the secondary side electrode of the piezoelectric transformer;

a detection section for detecting an output state to the cold-cathode tube to generate a detection signal;

a control section for generating a control signal for controlling a driving frequency and input power of the piezoelectric transformer based on the detection signal output from the detection section; and a driving section for supplying the driving signal to the piezoelectric transformer based on the control signal output from the control section, wherein the driving signal is a signal in a rectangular waveform having a first time period in which a level is a maximum potential or a minimum potential, obtained by multiplying a period of the driving signal by a first time ratio and a second time period in which a level is a potential between the maximum potential and the minimum potential, obtained by multiplying a period of the driving signal by a second time ratio, and the control section sets a sum of the first time ratio and the second time ratio to be smaller than 0.5 and sets the first time ratio and the second time ratio so as to minimize a sum of ratios of values of respective higher order input currents with respect to a value of an input current with a frequency that excites the piezoelectric transformer, and generates the control signal based on the set first and second time ratios.

34. A liquid crystal panel including a cold-cathode tube light-emitting apparatus and having a brightness controlled by the cold-cathode tube light-emitting apparatus, the cold-cathode tube light-emitting apparatus comprising:

a piezoelectric transformer in which a primary side electrode and a secondary side electrode are formed in a piezoelectric body, and a driving signal input from the primary side electrode is converted and output from the secondary side electrode;

a cold-cathode tube connected to the secondary side electrode of the piezoelectric transformer;

a detection section for detecting an output state to the cold-cathode tube to generate a detection signal;

a control section for generating a control signal for controlling a driving frequency and input power of the piezoelectric transformer based on the detection signal output from the detection section; and a driving section for supplying the driving signal to the piezoelectric transformer based on the control signal output from the control section, wherein the driving signal is a signal in a rectangular waveform having time periods up to an n-th (n is a natural number of 1 or more) time period in which a level is varied successively from a maximum potential and a minimum potential to an intermediate potential, obtained by respectively multiplying a period of the driving signal by time ratios up to an n-th time ratio, and the control section sets a sum of the time ratios up to the n-th time ratio to be smaller than 0.5 and sets the time ratios up to the n-th time ratio so as to minimize a sum of ratios of amplitudes of respective higher order vibration modes with respect to an amplitude of a vibration mode that excites the piezoelectric transformer, and generates the control signal based on the set time ratios up to the n-th time ratio.

35. A liquid crystal panel including a cold-cathode tube light-emitting apparatus and having a brightness controlled by the cold-cathode tube light-emitting apparatus, the cold-cathode tube light-emitting apparatus comprising:

a piezoelectric transformer in which a primary side electrode and a secondary side electrode are formed in a piezoelectric body, and a driving signal input from the primary side electrode is converted and output from the secondary side electrode;

a cold-cathode tube connected to the secondary side electrode of the piezoelectric transformer;

a detection section for detecting an output state to the cold-cathode tube to generate a detection signal;

a control section for generating a control signal for controlling a driving frequency and input power of the piezoelectric transformer based on the detection signal output from the detection section; and a driving section for supplying the driving signal to the piezoelectric transformer based on the control signal output from the control section, wherein the driving signal is a signal in a rectangular waveform having a time period in which a level is a maximum potential or a minimum potential, obtained by multiplying a period of the driving signal by a predetermined time ratio, the control section sets the time ratio to be smaller than 0.5 and so as to minimize a sum of ratios of amplitudes of respective higher order vibration modes with respect to an amplitude of a vibration mode that excites the piezoelectric transformer, and generates the control signal based on the set time ratio.

36. A liquid crystal panel including a cold-cathode tube light-emitting apparatus and having a brightness controlled by the cold-cathode tube light-emitting apparatus, the cold-cathode tube light-emitting apparatus comprising:

a piezoelectric transformer in which a primary side electrode and a secondary side electrode are formed in a piezoelectric body, and a driving signal input from the primary side electrode is converted and output from the secondary side electrode;

a cold-cathode tube connected to the secondary side electrode of the piezoelectric transformer;

a detection section for detecting an output state to the cold-cathode tube to generate a detection signal;

a control section for generating a control signal for controlling a driving frequency and input power of the piezoelectric transformer based on the detection signal output from the detection section; and a driving section for supplying the driving signal to the piezoelectric transformer based on the control signal output from the control section, wherein the driving signal is a signal in a rectangular waveform having a first time period in which a level is a maximum potential or a minimum potential, obtained by multiplying a period of the driving signal by a first time ratio and a second time period in which a level is a potential between the maximum potential and the minimum potential, obtained by multiplying a period of the driving signal by a second time ratio, the control section sets a sum of the first time ratio and the second time ratio to be smaller than 0.5 and sets the first time ratio and the second time ratio so as to minimize a sum of ratios of amplitudes of respective higher order vibration modes with respect to an amplitude of a vibration mode that excites the piezoelectric transformer, and generates the control signal based on the set first and second time ratios.

37. A device with a built-in liquid crystal panel including a cold-cathode tube light-emitting apparatus and having a brightness controlled by the cold-cathode tube light-emitting apparatus, the cold-cathode tube light-emitting apparatus comprising:

a piezoelectric transformer in which a primary side electrode and a secondary side electrode are formed in a piezoelectric body, and a driving signal input from the primary side electrode is converted and output from the secondary side electrode;

a cold-cathode tube connected to the secondary side electrode of the piezoelectric transformer;

a detection section for detecting an output state to the cold-cathode tube to generate a detection signal;

a control section for generating a control signal for controlling a driving frequency and input power of the piezoelectric transformer based on the detection signal output from the detection section; and a driving section for supplying the driving signal to the piezoelectric transformer based on the control signal output from the control section, wherein the driving signal is a signal in a rectangular waveform having time periods up to an n-th (n is a natural number of 1 or more) time period in which a level is varied successively from a maximum potential and a minimum potential to an intermediate potential, obtained by respectively multiplying a period of the driving signal by time ratios up to an n-th time ratio, and the control section sets a sum of the time ratios up to the n-th time ratio to be smaller than 0.5 and sets the time ratios up to the n-th time ratio so as to minimize a sum of ratios of values of respective higher order input currents with respect to a value of an input current with a frequency that excites the piezoelectric transformer, and generates the control signal based on the set time ratios up to the n-th time ratio.

38. A device with a built-in liquid crystal panel including a cold-cathode tube light-emitting apparatus and having a brightness controlled by the cold-cathode tube light-emitting apparatus, the cold-cathode tube light-emitting apparatus comprising:

a piezoelectric transformer in which a primary side electrode and a secondary side electrode are formed in a piezoelectric body, and a driving signal input from the primary side electrode is converted and output from the secondary side electrode;

a cold-cathode tube connected to the secondary side electrode of the piezoelectric transformer;

a detection section for detecting an output state to the cold-cathode tube to generate a detection signal;

a control section for generating a control signal for controlling a driving frequency and input power of the piezoelectric transformer based on the detection signal output from the detection section; and a driving section for supplying the driving signal to the piezoelectric transformer based on the control signal output from the control section, wherein the driving signal is a signal in a rectangular waveform having a time period in which a level is a maximum potential or a minimum potential, obtained by multiplying a period of the driving signal by a predetermined time ratio, and the control section sets the time ratio to be smaller than 0.5 and so as to minimize a sum of ratios of values of respective higher order input currents with respect to a value of an input current of a frequency that excites the piezoelectric transformer, and generates the control signal based on the set time ratio.

39. A device with a built-in liquid crystal panel including a cold-cathode tube light-emitting apparatus and having a brightness controlled by the cold-cathode tube light-emitting apparatus, the cold-cathode tube light-emitting apparatus comprising:

a piezoelectric transformer in which a primary side electrode and a secondary side electrode are formed in a piezoelectric body, and a driving signal input from the primary side electrode is converted and output from the secondary side electrode;

a cold-cathode tube connected to the secondary side electrode of the piezoelectric transformer;

a detection section for detecting an output state to the cold-cathode tube to generate a detection signal;

a control section for generating a control signal for controlling a driving frequency and input power of the piezoelectric transformer based on the detection signal output from the detection section; and a driving section for supplying the driving signal to the piezoelectric transformer based on the control signal output from the control section, wherein the driving signal is a signal in a rectangular waveform having a first time period in which a level is a maximum potential or a minimum potential, obtained by multiplying a period of the driving signal by a first time ratio and a second time period in which a level is a potential between the maximum potential and the minimum potential, obtained by multiplying a period of the driving signal by a second time ratio, and the control section sets a sum of the first time ratio and the second time ratio to be smaller than 0.5 and sets the first time ratio and the second time ratio so as to minimize a sum of ratios of values of respective higher order input currents with respect to a value of an input current with a frequency that excites the piezoelectric transformer, and generates the control signal based on the set first and second time ratios.

40. A device with a built-in liquid crystal panel including a cold-cathode tube light-emitting-apparatus and having a brightness controlled by the cold-cathode tube light-emitting apparatus, the cold-cathode tube light-emitting apparatus comprising:

a piezoelectric transformer in which a primary side electrode and a secondary side electrode are formed in a piezoelectric body, and a driving signal input from the primary side electrode is converted and output from the secondary side electrode;

a cold-cathode tube connected to the secondary side electrode of the piezoelectric transformer;

a detection section for detecting an output state to the cold-cathode tube to generate a detection signal;

a control section for generating a control signal for controlling a driving frequency and input power of the piezoelectric transformer based on the detection signal output from the detection section; and a driving section for supplying the driving signal to the piezoelectric transformer based on the control signal output from the control section, wherein the driving signal is a signal in a rectangular waveform having time periods up to an n-th (n is a natural number of 1 or more) time period in which a level is varied successively from a maximum potential and a minimum potential to an intermediate potential, obtained by respectively multiplying a period of the driving signal by time ratios up to an n-th time ratio, and the control section sets a sum of the time ratios up to the n-th time ratio to be smaller than 0.5 and sets the time ratios up to the n-th time ratio so as to minimize a sum of ratios of amplitudes of respective higher order vibration modes with respect to an amplitude of a vibration mode that excites the piezoelectric transformer, and generates the control signal based on the set time ratios up to the n-th time ratio.

41. A device with a built-in liquid crystal panel including a cold-cathode tube light-emitting apparatus and having a brightness controlled by the cold-cathode tube light-emitting apparatus, the cold-cathode tube light-emitting apparatus comprising:

a piezoelectric transformer in which a primary side electrode and a secondary side electrode are formed in a piezoelectric body, and a driving signal input from the primary side electrode is converted and output from the secondary side electrode;

a cold-cathode tube connected to the secondary side electrode of the piezoelectric transformer;

a detection section for detecting an output state to the cold-cathode tube to generate a detection signal;

a control section for generating a control signal for controlling a driving frequency and input power of the piezoelectric transformer based on the detection signal output from the detection section; and a driving section for supplying the driving signal to the piezoelectric transformer based on the control signal output from the control section, wherein the driving signal is a signal in a rectangular waveform having a time period in which a level is a maximum potential or a minimum potential, obtained by multiplying a period of the driving signal by a predetermined time ratio, the control section sets the time ratio to be smaller than 0.5 and so as to minimize a sum of ratios of amplitudes of respective higher order vibration modes with respect to an amplitude of a vibration mode that excites the piezoelectric transformer, and generates the control signal based on the set time ratio.

42. A device with a built-in liquid crystal panel including a cold-cathode tube light-emitting apparatus and having a brightness controlled by the cold-cathode tube light-emitting apparatus, the cold-cathode tube light-emitting apparatus comprising:

a piezoelectric transformer in which a primary side electrode and a secondary side electrode are formed in a piezoelectric body, and a driving signal input from the primary side electrode is converted and output from the secondary side electrode;

a cold-cathode tube connected to the secondary side electrode of the piezoelectric transformer;

a detection section for detecting an output state to the cold-cathode tube to generate a detection signal;

a control section for generating a control signal for controlling a driving frequency and input power of the piezoelectric transformer based on the detection signal output from the detection section; and a driving section for supplying the driving signal to the piezoelectric transformer based on the control signal output from the control section, wherein the driving signal is a signal in a rectangular waveform having a first time period in which a level is a maximum potential or a minimum potential, obtained by multiplying a period of the driving signal by a first time ratio and a second time period in which a level is a potential between the maximum potential and the minimum potential, obtained by multiplying a period of the driving signal by a second time ratio, the control section sets a sum of the first time ratio and the second time ratio to be smaller than 0.5 and sets the first time ratio and the second time ratio so as to minimize a sum of ratios of amplitudes of respective higher order vibration modes with respect to an amplitude of a vibration mode that excites the piezoelectric transformer, and generates the control signal based on the set first and second time ratios.

* * * * *